United States Patent
Lin et al.

(10) Patent No.: US 11,062,987 B2
(45) Date of Patent: Jul. 13, 2021

(54) SEMICONDUCTOR DEVICE

(71) Applicant: Taiwan Semiconductor Manufacturing Company, Ltd., Hsinchu (TW)

(72) Inventors: Jing-Cheng Lin, Hsinchu (TW); Chi-Hsi Wu, Hsinchu (TW); Chen-Hua Yu, Hsinchu (TW); Po-Hao Tsai, Zhongli (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/846,993

(22) Filed: Apr. 13, 2020

(65) Prior Publication Data
US 2020/0243435 A1    Jul. 30, 2020

Related U.S. Application Data

(63) Continuation of application No. 16/200,029, filed on Nov. 26, 2018, now Pat. No. 10,622,297, which is a (Continued)

(51) Int. Cl.
*H01L 23/00* (2006.01)
*H01L 25/065* (2006.01)
(Continued)

(52) U.S. Cl.
CPC .... *H01L 23/49838* (2013.01); *H01L 21/4853* (2013.01); *H01L 23/49816* (2013.01);
(Continued)

(58) Field of Classification Search
CPC . H01L 21/4853; H01L 21/78; H01L 21/6835; H01L 21/565; H01L 21/486;
(Continued)

(56) References Cited

U.S. PATENT DOCUMENTS

| 7,491,636 B2 | 2/2009 | Farnworth |
| 8,450,856 B2 | 5/2013 | Kang et al. |

(Continued)

FOREIGN PATENT DOCUMENTS

| KR | 20160063237 A | 6/2016 |
| KR | 20160074391 A | 6/2016 |

*Primary Examiner* — Nikolay K Yushin
(74) *Attorney, Agent, or Firm* — Slater Matsil, LLP

(57) ABSTRACT

A semiconductor device includes a substrate, a first redistribution layer (RDL) over a first side of the substrate, one or more semiconductor dies over and electrically coupled to the first RDL, and an encapsulant over the first RDL and around the one or more semiconductor dies. The semiconductor device also includes connectors attached to a second side of the substrate opposing the first side, the connectors being electrically coupled to the first RDL. The semiconductor device further includes a polymer layer on the second side of the substrate, the connectors protruding from the polymer layer above a first surface of the polymer layer distal the substrate. A first portion of the polymer layer contacting the connectors has a first thickness, and a second portion of the polymer layer between adjacent connectors has a second thickness smaller than the first thickness.

20 Claims, 18 Drawing Sheets

Related U.S. Application Data continuation of application No. 15/641,091, filed on Jul. 3, 2017, now Pat. No. 10,141,253.

(60) Provisional application No. 62/421,903, filed on Nov. 14, 2016.

(51) Int. Cl.
*H01L 23/498* (2006.01)
*H01L 21/48* (2006.01)

(52) U.S. Cl.
CPC .............. *H01L 24/06* (2013.01); *H01L 24/14* (2013.01); *H01L 25/0652* (2013.01); *H01L 25/0655* (2013.01); H01L 23/49827 (2013.01); H01L 23/49894 (2013.01); H01L 24/05 (2013.01); H01L 24/11 (2013.01); H01L 24/13 (2013.01); H01L 24/16 (2013.01); H01L 24/29 (2013.01); H01L 24/32 (2013.01); H01L 24/81 (2013.01); H01L 24/83 (2013.01); H01L 24/97 (2013.01); H01L 2224/023 (2013.01); H01L 2224/0401 (2013.01); H01L 2224/05611 (2013.01); H01L 2224/1144 (2013.01); H01L 2224/1145 (2013.01); H01L 2224/131 (2013.01); H01L 2224/13105 (2013.01); H01L 2224/13111 (2013.01); H01L 2224/16227 (2013.01); H01L 2224/16238 (2013.01); H01L 2224/2919 (2013.01); H01L 2224/32225 (2013.01); H01L 2224/73204 (2013.01); H01L 2224/81121 (2013.01); H01L 2224/81815 (2013.01); H01L 2224/83104 (2013.01); H01L 2224/92125 (2013.01); H01L 2224/97 (2013.01); H01L 2924/15311 (2013.01)

(58) Field of Classification Search
CPC ............. H01L 21/563; H01L 21/78877; H01L 23/49816; H01L 23/49838; H01L 23/49894; H01L 23/49827; H01L 24/06; H01L 24/14; H01L 24/29; H01L 24/97; H01L 24/05; H01L 24/81; H01L 24/16; H01L 24/32; H01L 24/83; H01L 24/11; H01L 24/13; H01L 25/0652; H01L 25/50; H01L 25/105; H01L 25/03; H01L 2224/1145; H01L 2224/1144; H01L 2224/2919; H01L 2224/83104; H01L 2224/023; H01L 2224/13111; H01L 2224/05611; H01L 2224/81121; H01L 2224/13105; H01L 2224/97; H01L 2224/0401; H01L 2224/16227; H01L 2224/16238; H01L 2224/92125; H01L 2224/81815; H01L 2224/73204; H01L 2224/32225; H01L 2224/131; H01L 2224/81; H01L 2224/16225; H01L 2924/15311; H01L 2924/014; H01L 2924/00014; H01L 2924/01047; H01L 2924/01082; H01L 2924/0665; H01L 2924/00

See application file for complete search history.

(56) References Cited

U.S. PATENT DOCUMENTS

| | | | |
|---|---|---|---|
| 8,643,148 B2 | 2/2014 | Lin et al. | |
| 8,802,504 B1 | 8/2014 | Hou et al. | |
| 8,803,292 B2 | 8/2014 | Chen et al. | |
| 8,803,316 B2* | 8/2014 | Lin | H01L 21/76898 257/737 |
| 8,993,380 B2 | 3/2015 | Hou et al. | |
| 9,263,412 B2 | 2/2016 | Lin et al. | |
| 9,281,254 B2 | 3/2016 | Yu et al. | |
| 9,299,649 B2 | 3/2016 | Chiu et al. | |
| 9,496,189 B2 | 3/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 2007/0020916 A1 | 1/2007 | Farnworth | |
| 2012/0153498 A1 | 6/2012 | Kang et al. | |
| 2013/0134559 A1 | 5/2013 | Lin et al. | |
| 2013/0140690 A1* | 6/2013 | Lin | H01L 24/05 257/737 |
| 2014/0367867 A1 | 12/2014 | Lin et al. | |
| 2016/0148887 A1 | 5/2016 | Yu et al. | |
| 2016/0181218 A1 | 6/2016 | Karhade et al. | |

* cited by examiner

SEMICONDUCTOR DEVICE

PRIORITY CLAIM AND CROSS-REFERENCE

This application is a continuation of U.S. patent application Ser. No. 16/200,029, filed Nov. 26, 2018, entitled "Semiconductor Device and Method," which is a continuation of U.S. patent application Ser. No. 15/641,091, filed Jul. 3, 2017, entitled "Semiconductor Device and Method," now U.S. Pat. No. 10,141,253 issued on Nov. 27, 2018, which claims priority to U.S. Provisional Patent Application No. 62/421,903, filed Nov. 14, 2016, entitled "Semiconductor Device and Method," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Due to the differences in the coefficient of thermal expansion (CTE) of different materials used in the stacked semiconductor device, warpage of the stacked semiconductor device may occur, which may adversely affect the functionalities of the semiconductor device. If left uncompensated, severe warpage of semiconductor device may cause device failure and/or negatively impact the yield of the semiconductor manufacturing process.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
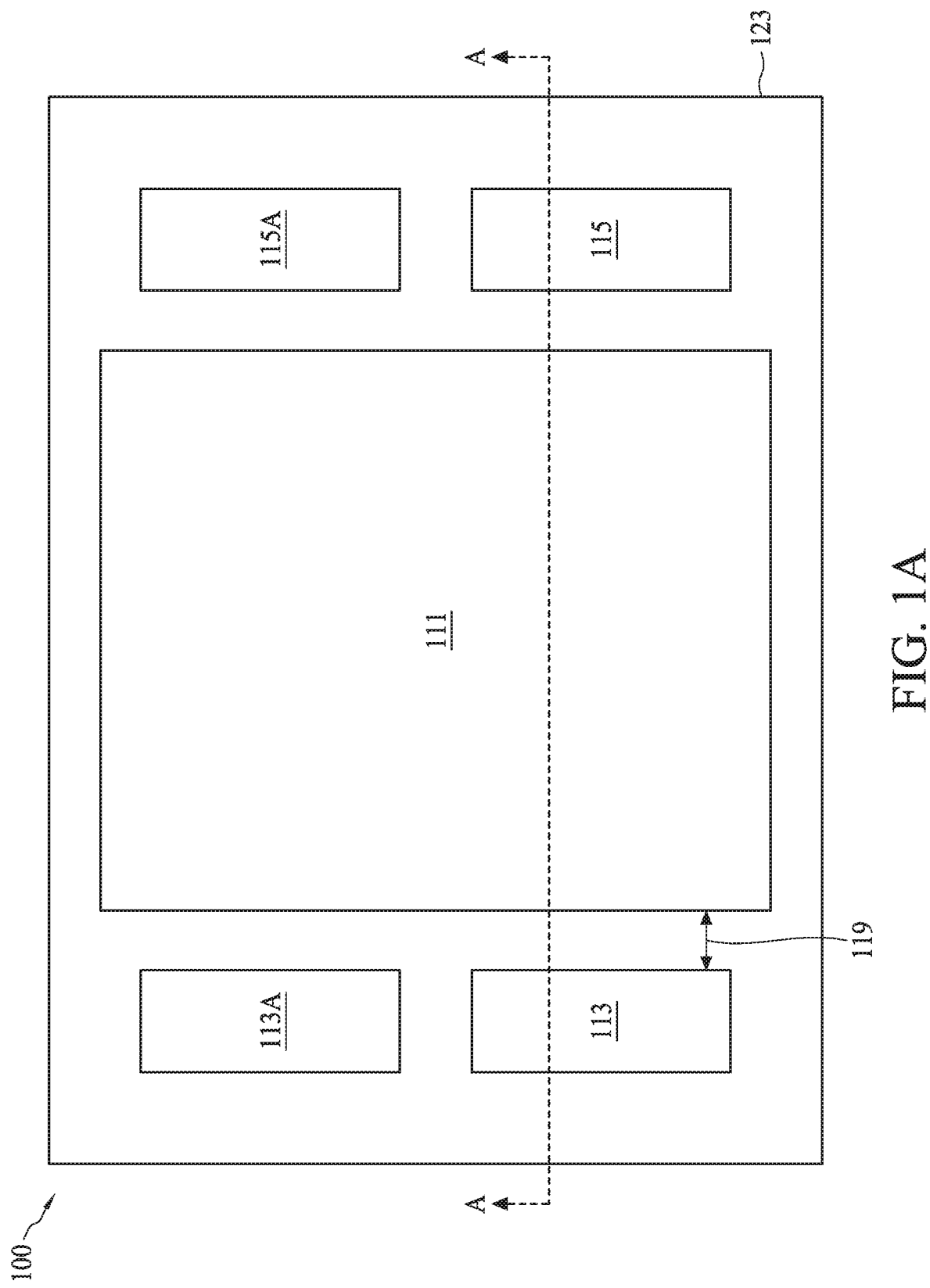
FIGS. 1A and 1B illustrate a top view and a cross-sectional view of a semiconductor device, respectively, in some embodiments.

FIG. 1A illustrates a top view of a semiconductor device 100, in some embodiments. In FIG. 1A, a semiconductor die 111 is attached to a first side of a first substrate 123. One or more semiconductor dies (e.g., 113, 113A, 115, 115A) are attached to the first side of the first substrate 123, and are adjacent to the semiconductor die 111. As illustrated in FIG. 1A, the semiconductor die 111 is disposed over a center region of the first substrate 123, and the semiconductor dies 113, 113A, 115, and 115A are disposed over edge regions (e.g., regions proximate exterior perimeters) of the first substrate 123. The semiconductor dies 111, 113, 113A, 115, and 115A may be any suitable dies, such as logic dies, DRAM dies, SRAM dies, combinations of these, or the like. Additionally, while the semiconductor dies 111, 113, 113A, 115, 115A may be the same type of device (e.g., all of the dies are DRAM dies), they may alternatively be different types of dies. For example, the semiconductor die 111 may be a logic die such as a system-on-chip (SoC) die, and the semiconductor dies 113, 113A, 115, 115A may be memory dies such as high-bandwidth memory (HBM) dies. The semiconductor dies 111, 113, 113A, 115, 115A may also comprise a stack of multiple dies. Any suitable combination of semiconductor dies, and any number of semiconductor dies, may alternatively be utilized, and all such numbers, combinations, and functionalities are fully intended to be included within the scope of the embodiments. Note that for clarity, underfill material 133 and molding material 135 (see FIG. 1B) are not illustrated in FIG. 1A.

Figure 1B:
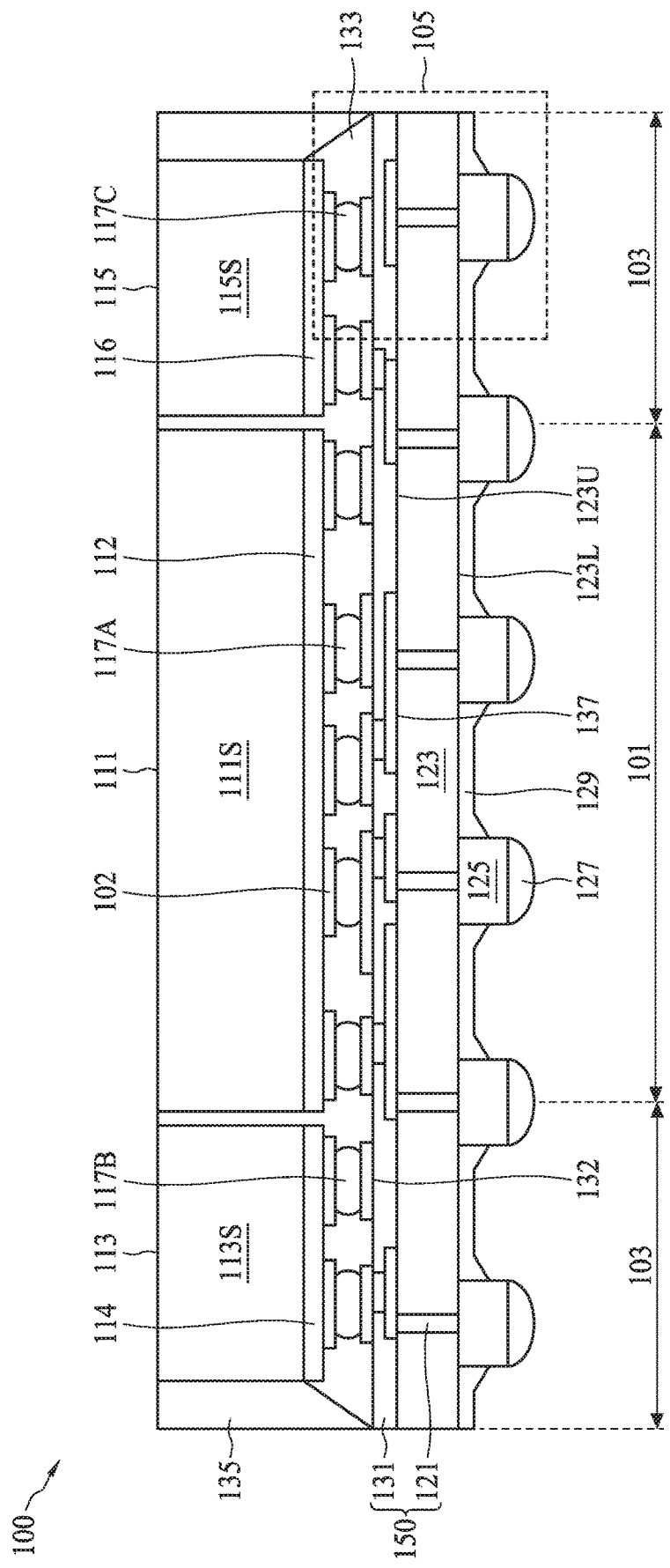

FIG. 1B is a cross-sectional view of the semiconductor device 100 along line A-A in FIG. 1A. As illustrated in FIG. 1B, the semiconductor device 100 includes an interposer 150, which includes a first substrate 123, a first redistribution layer (RDL) 131 on a first side 123U of the first substrate 123, external connectors 125 on a second side 123L of the first substrate 123, and conductive paths 121 (e.g., electrically conductive paths such as through substrate vias (TSVs)) in the first substrate 123 and electrically coupling the first RDL 131 with the external connectors 125.

The semiconductor dies 111, 113, and 115 (and the semiconductor dies 113A and 115A, which are not visible in the cross-sectional view of FIG. 1B) are physically and electrically coupled to the first RDL 131 via connectors (may also be referred to as external contacts) 117 (e.g., 117A, 117B and 117C). An underfill material (also referred to as an underfill) 133 may fill a gap between the semiconductor dies 111, 113, 115 and the first RDL 131. As illustrated in FIG. 1B, a molding material 135 is formed over the first side 123U of the first substrate 123 and around the semiconductor dies 111, 113, 115 and the underfill material 133. The underfill material 133 and the molding material 135 may be collectively referred to as an encapsulant. In embodiments where only the underfill material 133 or only the molding material 135 is used, the underfill material 133 or the molding material 135 may be referred to as an encapsulant.

Still referring to FIG. 1B, a polymer layer 129 is formed on the second side 123L of the first substrate 123. Although the polymer layer 129 is used as examples in the discussion hereinafter, it is understood that other suitable dielectric layer(s) may also be used in place of the polymer layer 129 and are fully intended to be included within the scope of the present disclosure. The polymer layer 129 is selectively formed over the second side 123L of the first substrate 123 (e.g., between adjacent external connectors 125) without covering the top surfaces (e.g., the surfaces having solder 127) of the external connectors 125. For example, the polymer layer 129 contacts sidewalls of the external connectors 125, but does not contact or cover the top surfaces of the external connectors 125. In the illustrated embodiment, the external connectors 125 protrude beyond the lower surface of the polymer layer 129 distal the first substrate 123.

Although not shown in FIG. 1B, a dielectric layer (e.g., a passivation layer) may be formed over the second side 123L of the first substrate 123, e.g., between the first substrate 123 and the external connectors 125. This dielectric layer may be used to prevent or reduce metal diffusion (e.g., diffusion of the metal of the external connectors 125) into the first substrate 123, and may comprise suitable dielectric materials such as silicon oxide, silicon nitride, low-k dielectrics such as carbon doped oxides, extremely low-k dielectrics such as porous carbon doped silicon dioxide, combinations thereof, or the like. In some embodiments, the dielectric layer may comprise a polymer material such as low temperature polyimide (PI), polybenzoxazole (PBO), combinations thereof, or the like. Any suitable formation method, such as chemical vapor deposition (CVD), physical vapor deposition (PVD), may be used to form the dielectric layer.

Details of the semiconductor device 100 are described hereinafter. The semiconductor die 111 may comprise a second substrate 1115, first electrical components on the second substrate (not individually illustrated), first metallization layers (represented in FIG. 1B by the single layer labeled 112), a first passivation layer (not shown), and first external contacts 117A (illustrated in FIG. 1B as already bonded to conductive pads 132 of the interposer 150, discussed further below). In an embodiment the second substrate 1115 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first electrical components comprise a wide variety of active devices (e.g., transistors) and passive devices (e.g., capacitors, resistors, inductors) and the like that may be used to generate the desired structural and functional requirements of the design for the semiconductor die 111. The first electrical components may be formed using any suitable methods either within or else on the second substrate 1115.

The first metallization layers 112 are formed over the second substrate 1115 and the first electrical components and are designed to connect the various first electrical components to form functional circuitry. In an embodiment the first metallization layers 112 are formed of alternating layers of dielectric and conductive material and may be formed through any suitable process (such as deposition, damascene, dual damascene, etc.). In an embodiment there may be four layers of metallization separated from the second substrate 1115 by at least one interlayer dielectric layer (ILD), but the precise number of first metallization layers 112 is dependent upon the design of the semiconductor die 111.

The first passivation layer (not shown) may be formed over the first metallization layers 112 in order to provide a degree of protection for the underlying structures. The first passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer may be formed through a process such as chemical vapor deposition (CVD), although any suitable process may be utilized.

The conductive pads 102 may be formed over and in electrical contact with the first metallization layer 112. The conductive pads 102 may comprise aluminum, but other materials, such as copper, may alternatively be used. The conductive pads 102 may be formed using a deposition process, such as sputtering or plating, to form a layer of material (not shown) and portions of the layer of material may then be removed through a suitable process (such as photolithographic masking and etching) to form the conductive pads 102. However, any other suitable process may be utilized to form the conductive pads 102.

The first external contacts 117A may be formed on conductive pads 102 to provide conductive regions for contact between the first metallization layers 112 and, e.g., the first RDL 131 on the first substrate 123. In an embodiment the first external contacts 117A may be contact bumps such as microbumps and may comprise a material such as tin, or other suitable materials, such as silver or copper. In an embodiment in which the first external contacts 117A are tin solder bumps, the first external contacts 117A may be formed by initially forming a layer of tin through any suitable method such as evaporation, electroplating, printing, solder transfer, ball placement. Once a layer of tin has been formed on the structure, a reflow is performed in order to shape the material into the desired bump shape with a diameter of about, e.g., 10 µm to 100 µm, although any suitable size may alternatively be utilized.

However, as one of ordinary skill in the art will recognize, while the first external contacts 117A have been described above as microbumps, these are merely intended to be illustrative and are not intended to limit the embodiments. Rather, any suitable type of external contacts, such as controlled collapse chip connection (C4) bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the first external contacts 117A, and all such external connectors are fully intended to be included within the scope of the embodiments.

The semiconductor die 113 may comprise a third substrate 113S, second electrical components (not individually illustrated in FIG. 1B), second metallization layers (represented in FIG. 1B by the single layer labeled 114), a second passivation layer (not shown), and second external contacts 117B. In an embodiment the third substrate 113S, the second electrical components, the second metallization layers 114, the second passivation layer, and the second external contacts 117B may be similar to the second substrate 111S, the first electrical components, the first metallization layers 112, the first passivation layer, and the first external contacts 117A, respectively, although they may alternatively be different materials formed from different processes. For example, the precise placement and formation of the various devices and layers will be dependent at least in part on the desired functionality of the semiconductor die 113.

The semiconductor die 115 may comprise a fourth substrate 115S, third electrical components (not individually illustrated in FIG. 1B), third metallization layers (represented in FIG. 1B by the single layer labeled 116), a third passivation layer (not shown), and third external contacts 117C. In an embodiment the fourth substrate 115S, the third electrical components, the third metallization layers 116, the third passivation layer, and the third external contacts 117C may be similar to the second substrate 111S, the first electrical components, the first metallization layers 112, the first passivation layer, and the first external contacts 117A, respectively, although they may alternatively be different materials formed from different processes. For example, the precise placement and formation of the various devices and layers will be dependent at least in part on the desired functionality of the semiconductor die 115.

Looking at the interposer 150, the first substrate 123 may be, e.g., a silicon substrate, doped or undoped, or an active layer of a silicon-on-insulator (SOI) substrate. However, the first substrate 123 may alternatively be a glass substrate, a ceramic substrate, a polymer substrate, or any other substrate that may provide a suitable protection and/or interconnection functionality. These and any other suitable materials may alternatively be used for the first substrate 123.

In some embodiments, the first substrate 123 may include electrical components, such as resistors, capacitors, signal distribution circuitry, combinations of these, or the like. These electrical components may be active, passive, or a combination thereof. In other embodiments, the first substrate 123 is free from both active and passive electrical components therein. All such combinations are fully intended to be included within the scope of the embodiments.

Additionally, in some embodiments the first substrate 123 is a semiconductor wafer, such as a twelve inch semiconductor wafer, at this stage in the manufacturing process. For example, the first substrate 123 may extend beyond the boundaries illustrated in FIG. 1B to include additional portions that will also comprise, e.g., TSVs for manufacturing additional structures. As such, when the semiconductor dies, e.g., semiconductor dies 111, 113, and 115, are bonded to the first substrate 123, the combined structure will be in a chip on wafer (CoW) configuration.

The conductive paths 121 may be TSVs or any other suitable conductive paths. In embodiments where conductive paths 121 are TSVs, the TSVs may be formed by initially forming electrically conductive paths partially through the first substrate 123, then thinning the first substrate 123 later to expose the electrically conductive paths. In other embodiments, the conductive paths 121, when formed initially, extends through the first substrate 123, and no thinning of the first substrate 123 is needed. The conductive paths 121 may be formed by forming a suitable photoresist or a hard mask on the first substrate 123, patterning the photoresist or the hard mask, and then etching the first substrate 123 to generate openings (e.g., TSV openings).

Once the openings for the conductive paths 121 have been formed, the openings may be filled with, e.g., a liner (not separately illustrated in FIG. 1B), a barrier layer (also not separately illustrated in FIG. 1B), and a conductive material. In an embodiment the liner may be a dielectric material such as silicon nitride, silicon oxide, a dielectric polymer, combinations of these, or the like, formed by a process such as chemical vapor deposition, oxidation, physical vapor deposition, atomic layer deposition, or the like.

The barrier layer may comprise a conductive material such as titanium nitride, although other materials, such as tantalum nitride, titanium, another dielectric, or the like may alternatively be utilized. The barrier layer may be formed using a CVD process, such as plasma-enhanced CVD (PECVD). However, other alternative processes, such as sputtering or metal organic chemical vapor deposition (MOCVD), atomic layer deposition (ALD), may alternatively be used. The barrier layer may be formed so as to contour to the underlying shape of the opening for the conductive paths 121.

The conductive material may comprise copper, although other suitable materials such as aluminum, tungsten, alloys, doped polysilicon, combinations thereof, and the like, may alternatively be utilized. The conductive material may be formed by depositing a seed layer and then electroplating copper onto the seed layer, filling and overfilling the openings for the conductive paths 121. Once the openings for the conductive paths 121 have been filled, excess barrier layer and excess conductive material outside of the openings may be removed through a grinding process such as chemical mechanical polishing (CMP), although any suitable removal process may be used.

Once the conductive paths 121 have been formed, the first redistribution layer (RDL) 131 may be formed on the first side 123U of the first substrate 123 in order to provide interconnectivity between the conductive paths 121, the external contacts 117, and the semiconductor dies 111, 113 and 115. The first RDL 131 comprises electrically conductive features (conducive lines and/or vias) disposed in one or more dielectric layers of the first RDL 131. The conductive features of the first redistribution layer 131 may be formed using common methods for forming interconnect structures in integrated circuits. In an embodiment the conductive features of the first RDL 131 comprises at least one conductive layer formed of a metal such as aluminum, copper, tungsten, titanium, or combinations thereof. The at least one conductive layer may be formed by forming a seed layer, covering the seed layer with a patterned photoresist (not illustrated), and then plating the metal on the seed layer within the openings of the photoresist. Once completed, the photoresist and portions of the seed layer underlying the photoresist are removed, leaving the at least one conductive layer, which may have a thickness of between about 0.5 μm and about 30 μm, with a width of about 5 μm. The one or more dielectric layers of the first RDL 131 may comprise silicon oxide, silicon nitride, low-k dielectrics such as carbon doped oxides, extremely low-k dielectrics such as porous carbon doped silicon dioxide, combinations of these, or the like, and may be formed through a process such as chemical vapor deposition (CVD), physical vapor deposition (PVD), or any other suitable deposition method.

After the first RDL 131 has been formed, an optional fourth passivation layer (not shown) may be formed over the first RDL 131, and vias may be formed through the fourth passivation layer to provide electrical access to the first RDL 131. In an embodiment the fourth passivation may be made of one or more suitable dielectric materials such as silicon oxide, silicon nitride, low-k dielectrics such as carbon doped oxides, extremely low-k dielectrics such as porous carbon doped silicon dioxide, low temperature polyimide (PI), polybenzoxazole (PBO), combinations of these, or the like. The fourth passivation layer may be formed through processes such as chemical vapor deposition (CVD), spin coating, and/or lithography process, although any suitable process may be utilized.

Once the first redistribution layer 131 (and the optional fourth passivation layer, if formed) have been formed, conductive pads 132 may be formed over and in electrical connection with the first RDL 131 on the first side 123U of the first substrate 123. The conductive pads 132 may comprise aluminum, but other materials, such as copper, may alternatively be used. The conductive pad 132 may be formed using a deposition process, such as sputtering, to form a layer of material (not shown) and portions of the layer of material may then be removed through a suitable process (such as photolithographic masking and etching) to form the conductive pad 132. However, any other suitable process may be utilized to form the conductive pad 132.

Although not shown in FIG. 1B, a second RDL may be formed over the second side 123L of the first substrate 123 and may be electrically coupled to the first RDL 131 though, e.g., conductive paths 121. In addition, a fifth passivation layer (not shown) may be formed over the second RDL. Materials and formation methods of the second RDL and the fifth passivation layer may be similar to those of the first RDL 131 and the fourth passivation layer, respectively, and therefore, details are not repeated here.

Next, external connectors 125 may be formed over the second side 123L of the first substrate 123 and may be electrically coupled to the first RDL 131 though, e.g., conductive paths 121. In cases where a second RDL and a fifth passivation layer are formed over the second side 123L of the first substrate 123, the external connectors 125 are formed over the fifth passivation layer and are electrically coupled to the second RDL, which in turn is electrically coupled to the first RDL 131 through, e.g., conductive paths 121. The external connectors 125 may be physically and electrically coupled to another substrate (not shown) in subsequent processing, e.g., by a reflow process, to form a chip on wafer on substrate (CoWoS) structure. In the illustrated embodiment, the external connectors 125 are copper pillars having a height between about 20 μm and about 70 μm, such as 40 μm, and a width between about 40 μm and about 170 μm, such as 80 μm. As illustrated in FIG. 1B, solder 127 is formed on the top surfaces of the external connectors 125 and may have a height between about 10 μm and about 50 μm. The dimensions of the external connectors 125 and solder 127 illustrated above are merely non-limiting examples, any other suitable dimensions for the external connectors 125 and solder 127 are possible and are fully intended to be included within the scope of the present disclosure.

In another embodiment, the external connectors 125 may be contact bumps such as controlled collapse chip connection (C4) bumps and may comprise a material such as tin, or other suitable materials, such as silver or copper. In an embodiment in which the external connectors 125 are tin solder bumps, the external connectors 125 may be formed by initially forming a layer of tin through any suitable method such as evaporation, electroplating, printing, solder transfer, ball placement, etc. Once a layer of tin has been formed on the structure, a reflow is performed in order to shape the material into the desired bump shape with a diameter, e.g., of about 80 μm.

However, as one of ordinary skill in the art will recognize, while the external connectors 125 have been described above as C4 bumps, these are merely intended to be illustrative and are not intended to limit the embodiments. Rather, any suitable type of external contacts, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 125, and all such external connectors are fully intended to be included within the scope of the embodiments.

Once ready, the semiconductor dies 111, 113 and 115 may be bonded to the interposer 150 using, e.g., a bonding process. In an embodiment in which the first external contacts 117 are solder microbumps, the bonding process may be performed by first aligning the first external contacts 117 with their respective conductive pads 132, and then the first external contacts 117 are placed in physical contact with the conductive pads 132. Once in contact, a reflow process may then be performed in order to reflow the first external contacts 117, thereby bonding the first external contacts 117 with the conductive pads 132.

Once bonded, the underfill material 133 may be injected or otherwise formed in the space between the interposer 150 and the semiconductor dies 111, 113 and 115. The first underfill material 133 may, for example, comprise a liquid epoxy that is dispensed between the semiconductor dies 111, 113, 115 and the first substrate 123, and then cured to harden. This first underfill material 133 may be used to prevent cracks from being formed in the first external contacts 117, where cracks are typically caused by thermal stresses.

As illustrated in FIG. 1B, the underfill 133 may also fill gaps 119 (see FIG. 1A) between sidewalls of adjacent semiconductor dies. The size (e.g., width) of the gaps 119 may range from about 30 μm to about 300 μm, and may be adjusted for various design requirements and considerations. For example, smaller gap size allows for higher integration density and results in smaller size for the semiconductor device 100, but may use the underfill 133 (which may be more expensive than the molding material 135) to fill the gaps 119. Conversely, larger gaps size allows for the use of the molding material 135 to fill gaps 119, but may result in larger device size, and may cause more warpage of the semiconductor device 100, as discussed in more detail below.

Depending on the size of gaps 119, the underfill 133 may extend to upper surfaces of the semiconductor dies 111, 113 and 115 due to capillary force based on the size of the gaps 119, as illustrated in the example of FIG. 1B. In other embodiment, the underfill 133 extends below the upper surfaces of the semiconductor dies 111, 113 and 115 (not shown) due to wider gaps 119 (hence weaker capillary force). Compared with the molding material 135, the underfill materials 133 may have a faster flow rate, a uniform and void free flow pattern, and a faster curing schedule. In addition, the underfill materials 133 may be able to fill gaps (e.g., gaps 119, or the gap between the interposer 150 and the semiconductor dies 111, 113, and 115) with small gap sizes (e.g., gaps with size between about 10 μm and 60 μm) that the molding materials 135 may be not able to fill.

Next, the molding material 135 is formed on the first side 123U of the first substrate 123 (e.g., over the first RDL 131). The molding material 135 surrounds the semiconductor dies 111, 113, 115, and the underfill material 133, in some embodiments. The molding material 135 may comprise an epoxy, an organic polymer, a polymer with or without a silica-based or glass filler added, or other materials, as examples. In some embodiments, the molding material 135 comprises a liquid molding compound (LMC) that is a gel type liquid when applied. The molding material 135 may also comprise a liquid or solid when applied. Alternatively, the molding material 135 may comprise other insulating and/or encapsulating materials. The molding material 135 is applied using a wafer level molding process in some embodiments. The molding material 135 may be molded using, for example, compressive molding, transfer molding, molded underfill (MUF), or other methods.

Next, the molding material 135 is cured using a curing process, in some embodiments. The curing process may comprise heating the molding material 135 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 135 may be cured using other methods. In some embodiments, a curing process is not included.

Although FIG. 1B shows the underfill material 133 filling the gap between the interposer 150 and the semiconductor dies 111, 113, 115, the molding material 135 may be used in place of the underfill material 133 to fill the gap if the gap size is large (e.g., larger than 10 μm). Similarly, when the size of the gaps 119 are large (e.g., larger than 40 μm), the molding material 135 may fill the gaps 119 in place of the underfill 133 (not shown in FIG. 1B). Different combinations of the underfill 133 and the molding material 135 are possible and are fully intended to be included within the scope of the present disclosure.

Due to the differences between the CTEs of the molding material 135, the underfill 133, and/or other materials used in the semiconductor device 100, warpage of the semiconductor device 100 may occur. For example, the CTE of the underfill material 133 may be between about 15 parts per million per degree)(ppm/C° to about 200 ppm/° C., such as 120 ppm/° C., and the CTE of the molding material 135 may be between about 4 ppm/° C. to about 80 ppm/° C., such as 26 ppm/° C. In the example of FIG. 1B, the molding material 135 is disposed in the edge regions 103 (e.g., the regions proximate exterior perimeters of the interposer 150, such as the regions in which the semiconductor dies 113 and 115 are disposed) of the interposer 150 and around the underfill material 133, therefore, at high temperatures (e.g., higher than 200° C.), the underfill material 133 expands more than the molding material 135, which may cause edge regions 103 of the interposer 150 to bend downward relative to the center region 101 (e.g., the region proximate the center of the interposer 150, such as the region in which the semiconductor die 111 is disposed) of the interposer 150. During a subsequent reflow process to couple the external connectors 125 of the semiconductor device 100 to corresponding conductive features (e.g., conductive pads, or connectors) of another substrate (not shown in FIG. 1B) to form a chip on wafer on substrate (CoWoS) structure, the warpage described above may result in cold joints in the center region 101 and/or solder bridges (e.g., solder connecting adjacent external connectors 125 thus causing electrical short) in the edge regions 103. Cold joints and solder bridges adversely affect the reliability of the CoWoS structure and reduce the yield of semiconductor manufacturing. As discussed below, the polymer layer 129 is formed to reduce the warpage of the semiconductor device 100 and to prevent or reduce cold joints and/or solder bridges.

Still referring to FIG. 1B, the polymer layer 129 is formed on the second side 123L of the first substrate 123. The polymer layer 129 is selectively dispensed over the second side 123L, e.g., between adjacent external connectors 125 without covering the top surfaces (e.g., the surfaces having solder 127) of the external connectors 125. The polymer layer 129 comprises polyimide (PI), polybenzoxazole (PBO), resin, epoxy, acrylic type polymer, combinations therefore, or the like, in some embodiments. In some embodiments, the polymer layer 129 comprises a molding material such as epoxy with a filler material (e.g., silicon oxide). In an embodiment, the polymer layer 129 comprises an underfill material. The polymer layer 129 may be in a liquid state when dispensed onto the second side 123L of the first substrate 123. Any suitable dispensing tool or method (e.g., jetting, dispensing) may be used to form the polymer layer 129.

The composition, location, thickness, and/or volume of the polymer layer 129 may be tuned to achieve a predetermined CTE and/or stress level to counteract the warpage of the semiconductor device 100. For example, in embodiments where the volume of the underfill material 133 dominates (e.g., occupies larger than about 60% of the total volume) the total volume of the underfill 133 and the molding material 135, the CTE and/or stress level of the polymer layer 129 may be tuned (e.g., by changing the composition, location, thickness and/or volume of the polymer layer 129) to match the CTE and/or stress level of the underfill material 133 to compensate for the warpage of the semiconductor device 100. In some embodiments, the volume or thickness of the polymer layer 129 is adjusted (e.g., increased) to compensate for the warpage of the semiconductor device 100. As another example, when a volume of the polymer layer 129 is smaller than a volume of the underfill material 133, the CTE and/or stress level of the polymer layer 129 may be tuned to be higher than the CTE and/or stress level of the underfill material 133 to provide enough compensation to reduce the warpage of the semiconductor device 100. As yet another example, when the molding material 135 is used in place of the underfill material 133, the CTE and/or stress level of the polymer layer 129 may be tuned to match the CTE and/or stress level of the molding material 135.

Figure 1C:
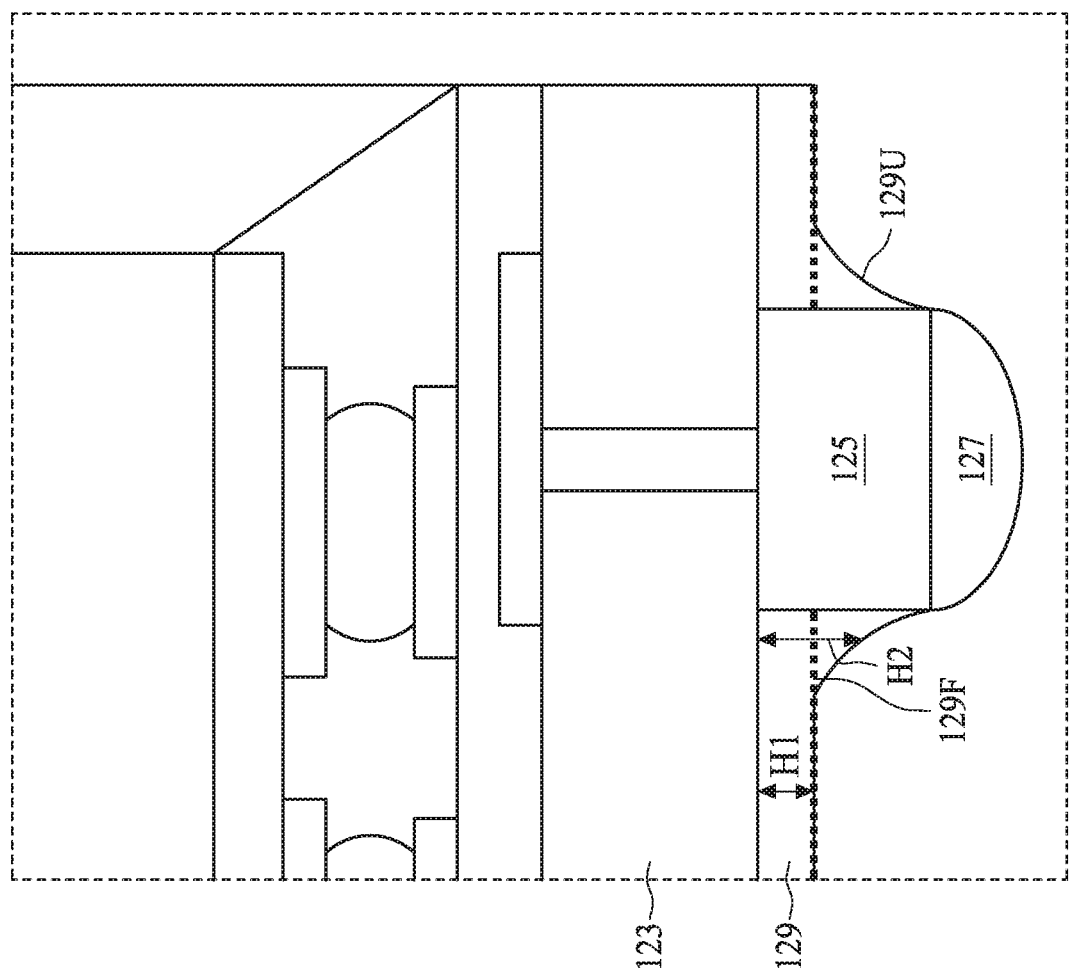
FIG. 1C illustrates a zoomed-in view of an area of FIG. 1B.

FIG. 1C shows a zoomed-in view of area 105 in FIG. 1B. In the illustrated example, due to the wetting of the polymer layer 129 on the external connectors 125, a first portion of the polymer layer 129 contacting sidewalls of the external connectors 125 has a height H2 (also referred to as a thickness H2 of the polymer layer 129), and a second portion of the polymer layer 129 away from the external connectors 125 (e.g., midway between two adjacent external connectors 125) has a height H1 (also referred to as a thickness H1 of the polymer layer 129). The height H2 is larger than the height H1, and the lower surface 129U of the polymer layer 129 distal the first substrate 123 may have a round profile proximate the external connectors 125, as illustrated in the example of FIG. 1C. Values of the height H1 and the height H2 may depend on various design factors, e.g., size of the external connectors 125, the wettability of the polymer layer 129, and the amount of warpage to compensate for using the polymer layer 129. For example, in an embodiment where the height (measured along the same direction as H2) of external connectors 125 is about 40 µm, the height H1 is between about 2 µm to about 40 µm, and the height H2 is between about 10 µm to about 70 µm. Other dimensions for the height H1 and the height H2 are possible and are fully intended to be included within the scope of the present disclosure.

Although the height H2 is shown to be larger than the height H1 in the example of FIG. 1C, depending on the material of the polymer layer 129 and the wettability of the polymer layer 129 on the external connectors 125, the height H2 may be the same as the height H1 (e.g., the polymer layer 129 having a uniform thickness), and the polymer layer 129 may have a flat upper surface 129F (see dashed line) contacting the sidewalls of the external connectors 125, in some embodiments.

Figure 1D:
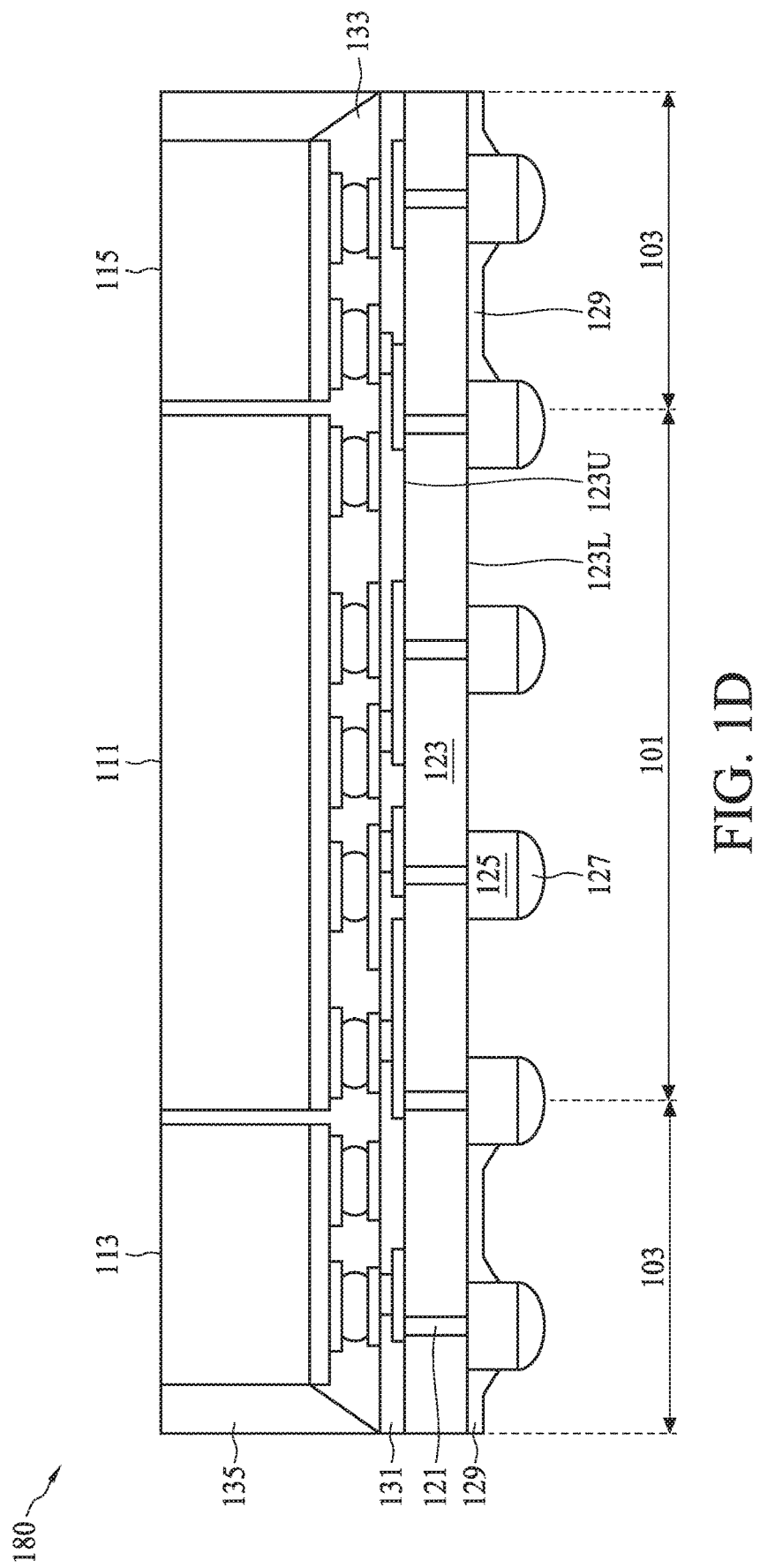
FIG. 1D illustrates a cross-sectional view of a semiconductor device, in an embodiment.

In FIG. 1B, the polymer layer 129 is disposed on the second side 123L of the first substrate 123 in center region 101 and edge regions 103. FIG. 1D illustrates another embodiment semiconductor device 180 which is similar to the semiconductor device 100 in FIG. 1B but with different locations for the polymer layer 129. In particular, the polymer layer 129 of semiconductor device 180 is disposed over a first portion of the second side 123L of the first substrate 123, and a second portion of the second side 123L is not covered (e.g., exposed) by the polymer layer 129. For example, in FIG. 1D, the center region 101 is free of (e.g., not covered by) the polymer layer 129, and the polymer layer 129 is formed in the edge regions 103. These and other variations and/or modifications to the polymer layer 129 are possible and are fully intended to be included within the scope of the present disclosure.

The thickness (e.g., the height H1 in FIG. 1C) and the locations (e.g., center region 101, and/or edge regions 103 in FIGS. 1B and 1D) of the polymer layer 129 determine the volume of the polymer layer 129, in some embodiments. The composition, thickness, and/or volume of the polymer layer 129 may be varied to achieve a target stress level to counteract the stress caused by, e.g., the underfill 133 and the molding material 135. In embodiments where the polymer layer 129 is disposed in both the center region 101 and the edge regions 103 of the interposer 150 (see FIG. 1B), a thickness (e.g., the height H1 in FIG. 1C) of the polymer layer 129 may be between 2 µm and 40 µm, and the stress level (e.g., elastic modulus) of the polymer layer 129 may be between 1 GPa to about 10 GPa. In embodiments where the polymer layer 129 are disposed in the edge regions 103 of the interposer 150 (see FIG. 1D), a thickness (e.g., the height H1 in FIG. 1C) of the polymer layer 129 may be between 2 µm and 40 µm, and the stress level (e.g., elastic modulus) of the polymer layer 129 may be between 1 GPa to about 10 GPa.

FIGS. 2A-2D illustrate cross-sectional views of a semiconductor structure 200 at various stages of fabrication, in accordance with an embodiment. The same numerals in FIG. 2A-2D denote the same elements or structures as in FIG. 1B, and a numeral in FIG. 2A-2D with suffix M denotes a component or structure comprising multiple copies of a respective element of structure in FIG. 1B that does not have the suffix M. For example, the interposer 150M in FIG. 2A comprises a plurality of regions 202, 204 and 206, with each region corresponding to the interposer 150 in FIG. 1B.

Figure 2A:
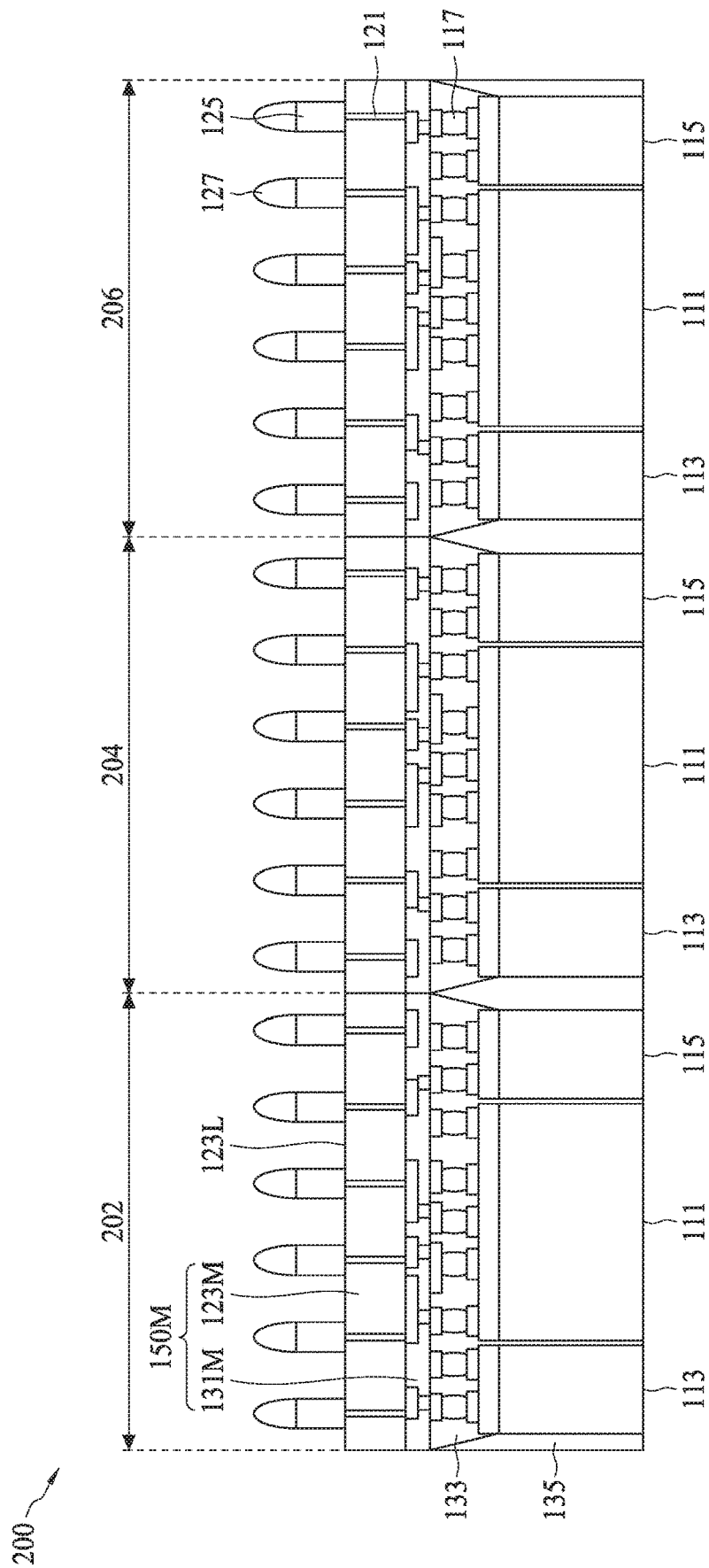
FIGS. 2A-2D illustrate cross-section views of a semiconductor device at various stages of fabrication, in accordance with an embodiment.

In FIG. 2A, an interposer 150M is provided. The interposer 150M comprises a substrate 123M, an RDL layer 131M, conductive paths 121 (e.g., TSVs or other electrically conductive paths), and external connectors 125 (e.g., C4 bumps). The interposer 150M has a plurality of regions 202, 204 and 206. As will be described in more details hereinafter, after a subsequent dicing process (see FIG. 2D), each of the regions (e.g., 202, 204, and 206) of semiconductor structure 200 becomes a semiconductor device such as semiconductor device 100 in FIG. 1B.

Although not shown in FIG. 2A, a dielectric layer (e.g., a passivation layer) may be formed over a second side 123L of the substrate 123M, e.g., between the substrate 123M and the external connectors 125. This dielectric layer may be used to prevent or reduce metal diffusion (e.g., diffusion of the metal of the external connectors 125) into the substrate 123M. Details regarding the materials and formation methods for this dielectric layer are similar to those described above with reference to FIG. 1B, thus are not repeated here.

To form the semiconductor structure 200, in each of the regions (e.g., 202, 204, and 206) of the interposer 150M, semiconductor dies 111, 113 and 115 are physically and electrically coupled to a corresponding portion of the RDL 131M through connectors 117 (e.g., microbumps). The underfill 133 fills the gap between the interposer 150M and the semiconductor dies 111, 113, and 115. The molding material 135 is formed over the RDL 131M and around the semiconductor dies 111, 113, 115, and the underfill 133. Details regarding the materials and formation methods for the underfill 133 and the molding material 135 are similar to those described above with reference to FIG. 1B, thus are not repeated here.

Figure 2B:
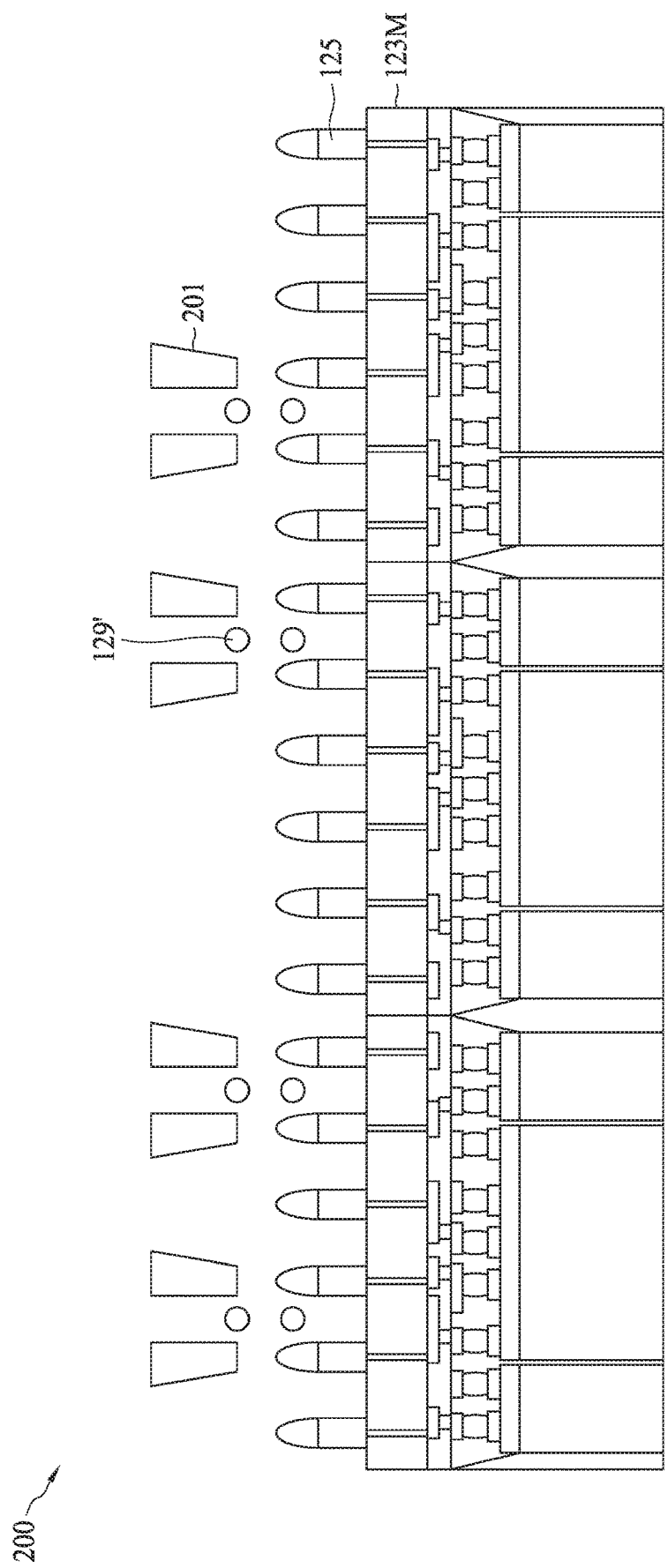

In FIG. 2B, a polymer material 129' is selectively deposited over substrate 123M (e.g., between adjacent external connectors 125) such that polymer material 129' does not cover upper surfaces (e.g., the surfaces of the external connectors 125 distal substrate 123M) of the external connectors 125. The composition of the polymer material 129' may be the same as the polymer layer 129 described above in FIG. 1B, thus details are not repeated here. The polymer material 129' is dispensed using dispensing tool 201. In some embodiments, the dispensing tool 201 has heating elements built in such that the polymer material 129' is in a liquid state when deposited. In some embodiments, the dispensing tool 201 has an UV light source built in such that the polymer material 129' is in a liquid state when deposited.

Figure 2C:
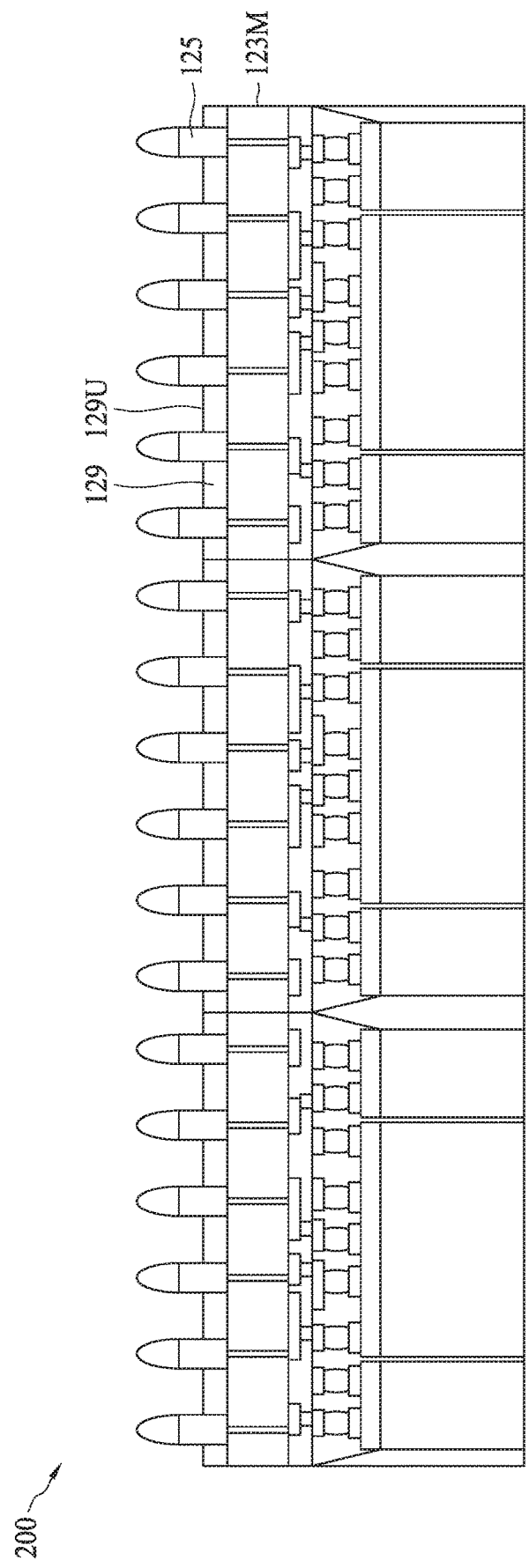

The deposited polymer material 129' forms the polymer layer 129 over substrate 123M, as illustrated in FIG. 2C. Depending on the wettability of the polymer layer 129 on the external connectors 125, the polymer layer 129 may have a flat upper surface 129U distal the substrate 123M, where the flat upper surface 129U contacts sidewalls of the external connectors 125, as illustrated in FIG. 2C. In other embodiments, the upper surface of the polymer layer 129 may have a round profile proximate the external connectors 125, e.g., similar to FIG. 1C, and the polymer layer 129 may have a first height H1 in a first portion away from the external connectors 125 (e.g., midway between adjacent external connectors 125), and a second height H2 in a second portion proximate (e.g., contacting sidewalls of) the external connectors 125, with H2 being larger than H1. Dimensions of the height H1 and the height H2 are discussed above with reference to FIG. 1C, thus details are not repeated here.

Once the polymer layer 129 is formed, a curing process is performed to fully cure the polymer layer 129. In some embodiments, the curing process is a thermal curing process performed at a temperature between about 130° C. to about 250° C., such as 180° C., and for a time interval between about 30 minutes to about 4 hours, such as 90 minutes. In other embodiments, an ultra violet (UV) curing process is performed to cure the polymer layer 129. The UV curing process may be performed using UV light with a wavelength between about 300 nm to about 396 nm, and a time interval for the UV curing process may be between about 5 seconds to about 180 seconds. The above curing processes are merely examples, other curing process and methods are also possible and are fully intended to be included within the scope of the present disclosure.

In other embodiments, a curing process is performed to partially cure the polymer layer 129. For example, a UV curing process is performed to partially cure the polymer layer 129. The partial UV curing process may use the same wavelength but a different time interval as the full UV curing process discussed above. For example, the time interval for the UV curing process may be adjusted (e.g., shortened) to achieve different levels of curing (e.g., full curing or partial curing). Similarly, a thermal curing process may be used to partially cure the polymer layer 129. The temperature and/or duration of the full thermal curing process discussed above may be modified (e.g., lower temperature, and/or shorten duration) to achieve different levels of curing. The partially cured polymer layer 129 may be further cured in a subsequent reflow process (e.g., a reflow process to attach the external connectors 125 of the semiconductor device 100 to another substrate to form a CoWoS structure), therefore the polymer layer 129 may be fully cured after the subsequent reflow process.

Figure 2D:
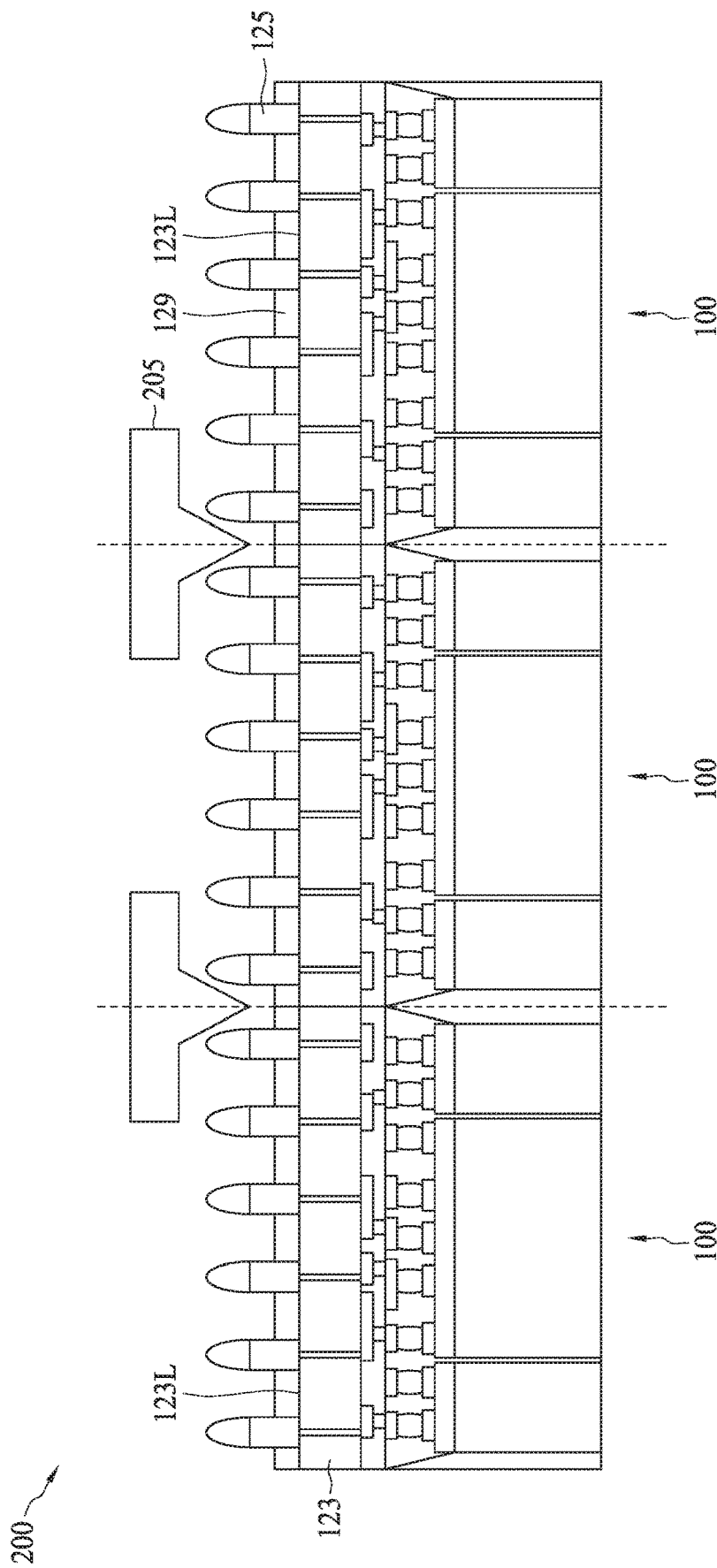

Next, in FIG. 2D, after the curing process, semiconductor structure 200 is diced along borders of different regions (e.g., 202, 204, 206 in FIG. 2A) using dicing tool 205, which may be a dicing blade or a laser dicing tool, as examples. After the dicing process, a plurality of semiconductor devices 100 (see also FIG. 1B) is formed. Note that in various embodiments, the polymer layer 129 is formed after the external connectors (e.g., 125 in FIG. 1B, 305 in FIG. 3B, and 507 in FIG. 5C) of the interposer (e.g., interposer 150) are formed, and before the interposer is attached to another substrate (e.g., to form a CoWoS structure).

FIG. 2D shows the polymer layer 129 disposed over the center region and the edge regions of each semiconductor device 100. In some embodiments, the polymer layer 129 may be formed over edge regions of each semiconductor device 100, and the center region of each semiconductor device 100 is free (e.g., not covered) of the polymer layer 129, similar to FIG. 1D. These and other variations and/or modifications to the polymer layer 129 are possible and are fully intended to be included within the scope of the present disclosure.

Figure 3A:
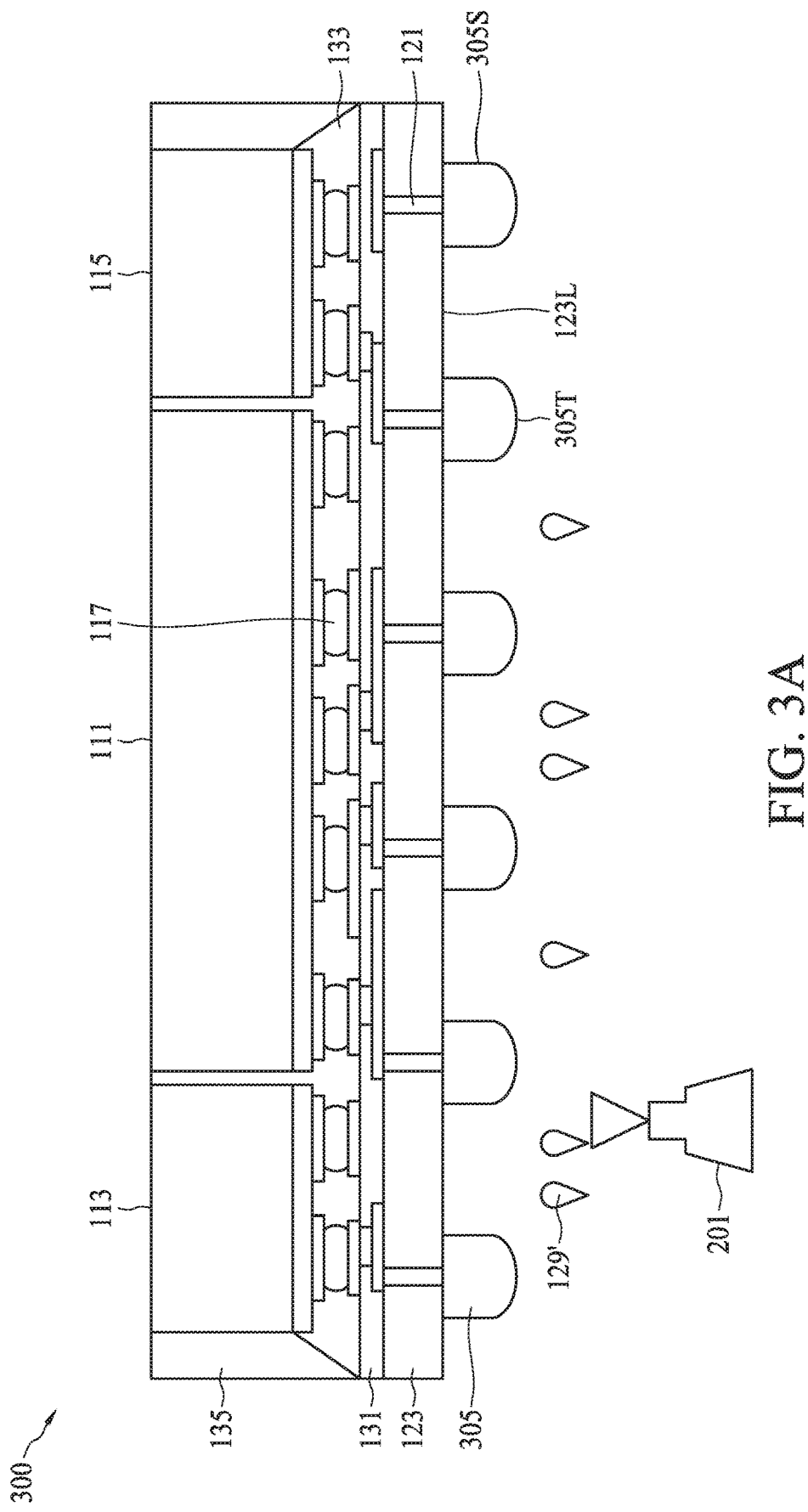
FIGS. 3A-3C illustrate cross-section views of a semiconductor device at various stages of fabrication, in an embodiment.
Figure 3B:
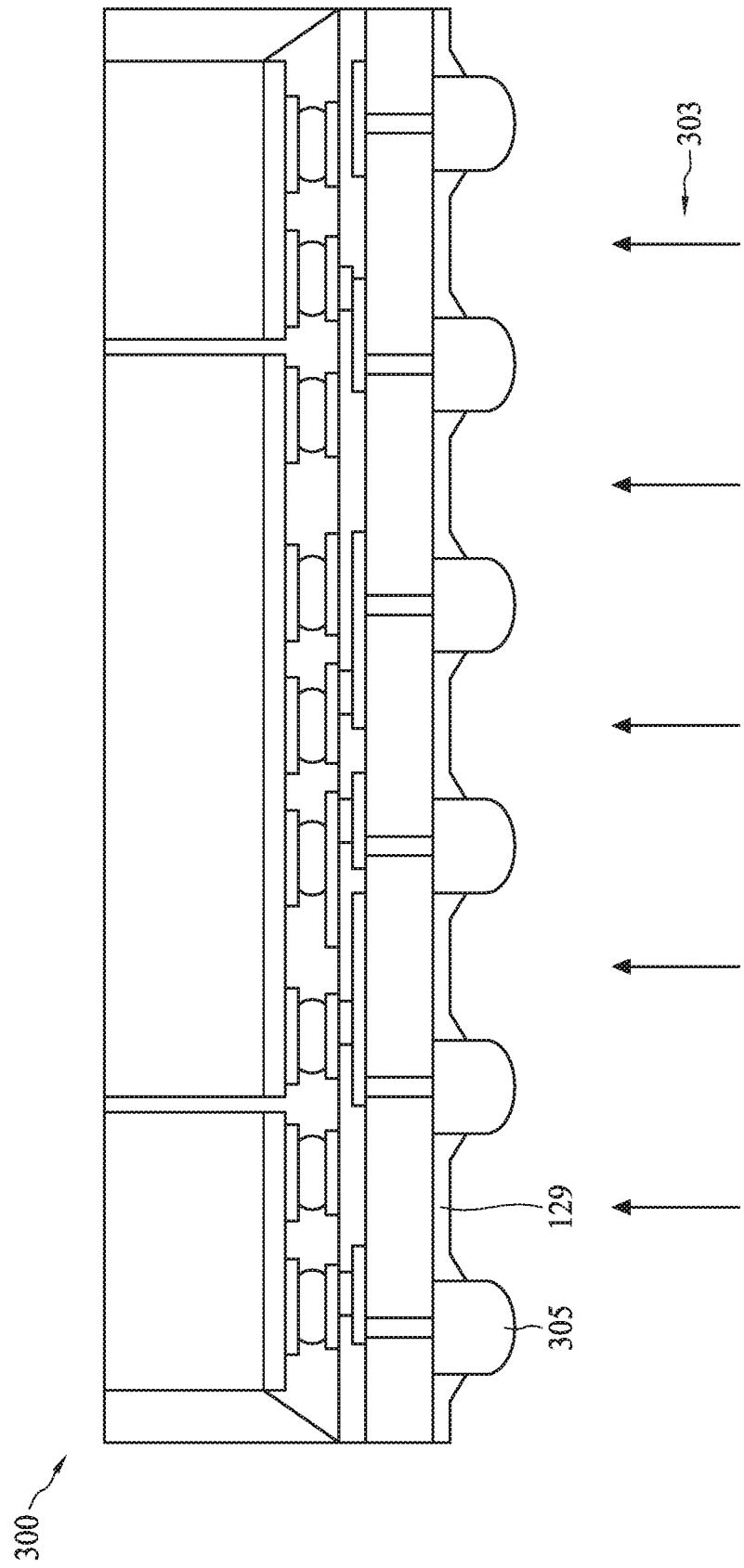
Figure 3C:
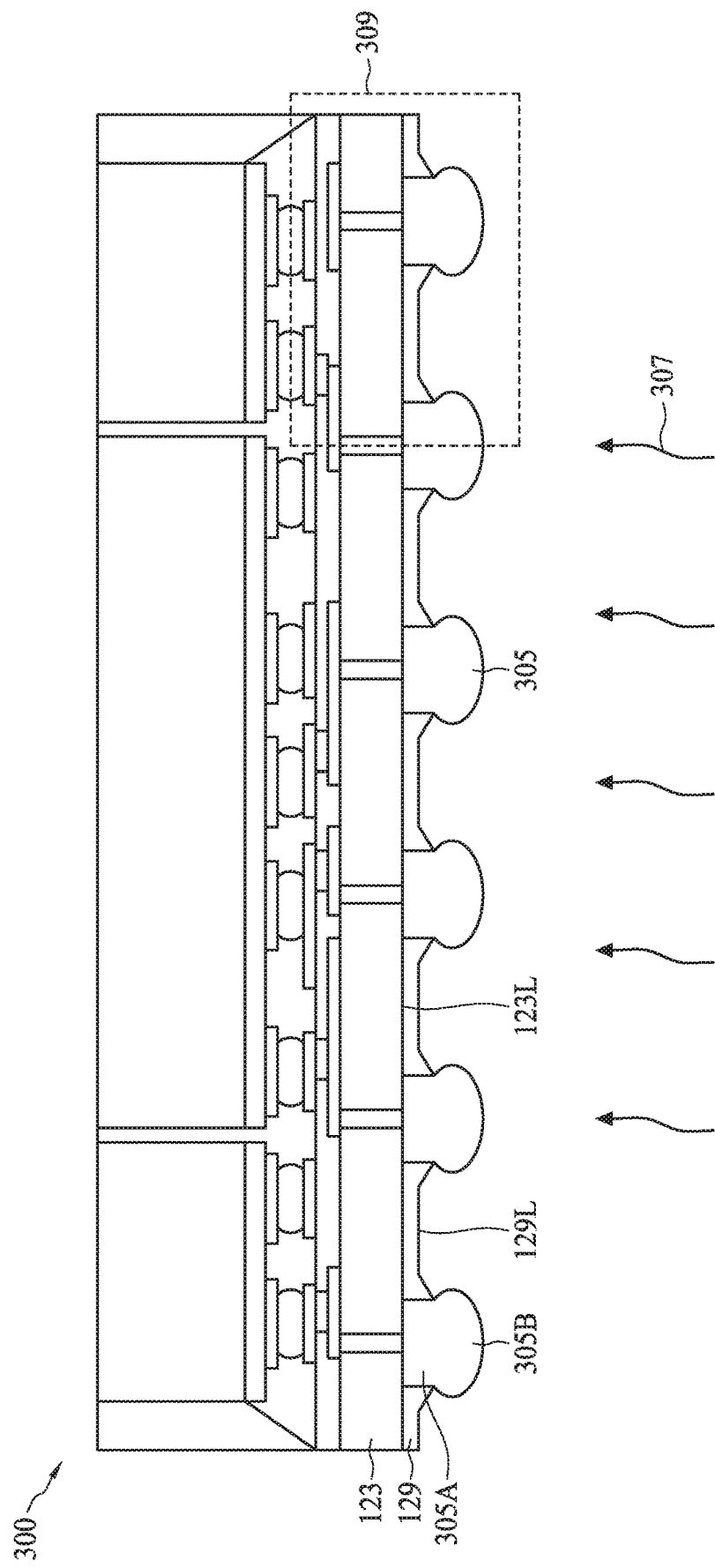

FIGS. 3A-3C illustrate cross-sectional views of a semiconductor device 300 at various stages of fabrication, in accordance with an embodiment. For simplicity, FIGS. 3A-3C only illustrate one semiconductor device 300, with the understanding that tens, hundreds, or even thousands of semiconductor devices 300 may be formed on an interposer and singulated subsequently to form a plurality of semiconductor devices 300. The same numerals in FIG. 3A-3C denote the same elements or structures as in FIG. 1B. Unless otherwise described, elements or structures with the same numerals are formed of the same material and using the same formation methods, hence details are not repeated.

In FIG. 3A, a semiconductor device 300 is formed. The semiconductor device 300 is similar to the semiconductor device 100 in FIG. 1B, except that in FIG. 3A, external connectors 305 are formed of solder and the polymer layer 129 is not formed. The external connectors 305 may be formed by first depositing a photo resist (not shown) over the second side 123L of the first substrate 123, patterning the photo resist to form openings at locations where the external connectors 305 are to be formed, and forming solder in the openings using suitable deposition methods such as plating. In the illustrated example, each of the external connectors 305 has flat (e.g., straight) sidewalls 305S, and therefore, a width between two opposing sidewalls 305S of an external connector 305 remains substantially uniform from a first end of the sidewalls 305S contacting the first substrate 123 to a second send of the sidewalls 305S distal the first substrate 123.

As illustrated in FIG. 3A, a polymer material 129' is selectively dispensed over the second side 123L of the first substrate 123 without covering top surfaces 305T of the external connectors 305, e.g., between adjacent external connectors 305 and/or next to external connectors 305 using dispensing tool 201. Deposited polymer material 129' forms the polymer layer 129, as shown in FIG. 3B.

Next, as illustrated in FIG. 3B, the polymer layer 129 is cured (e.g., fully cured or partially cured) by a curing process 303. In some embodiments, the curing process 303 is a UV curing process performed to fully cure the polymer layer 129. The UV curing process may be performed using UV light with a wavelength between about 300 nm to about 396 nm, and a time interval between about 5 seconds to about 180 seconds to fully cure the polymer layer 129. In other embodiments, a UV curing process is performed to partially cure the polymer layer 129, and a subsequent reflow process finishes the curing of the polymer layer 129. The partial UV curing process may use the same wavelength but a different time interval as the full UV curing process. For example, the time interval for the UV curing process may be adjusted (e.g., shortened) to achieve different level of curing (e.g., full curing or partial curing). After the curing process 303 (a partial UV curing process or a full UV curing process), the polymer layer 129 hardens and provides support and/or restraint for external connectors 305 during a subsequent reflow process. UV curing is used as a non-limiting example of the curing process 303 in the discussion above. Other appropriate curing processes may also be used and are fully intended to be included within the scope of the present disclosure.

Next, in FIG. 3C, a reflow process 307 is performed. The reflow process 307 melts the external connectors 305 (which are made of solder in the illustrated example). Due to the surface tension of the melted solder, first portions 305B (the portions protruding above the polymer layer 129) of the external connectors 305 have a round profile (e.g., a sphere or portions of a sphere) after the reflow process 307 is finished. Note that second portions 305A (the portions of external connectors 305 between the first portions 305B and the first substrate 123) of the external connectors 305 maintained flat (e.g., straight) sidewalls after the reflow process 307 is finished, due to the restraint provided by the hardened (e.g., partially cured or fully cured) polymer layer 129. In embodiments where the polymer layer 129 is partially cured by the curing process 303, the reflow process 307 also finishes the curing process, and thus, after the reflow process 307, the polymer layer 129 is fully cured.

FIGS. 3B and 3C illustrate the polymer layer 129 being formed over the second side 123L of the first substrate 123 and covering the center region and edge regions of the semiconductor device 300. In other embodiments (not shown), the polymer layer 129 is formed in the edge regions of the semiconductor device 300, and the center region of the semiconductor device 300 is free of the polymer layer 129, similar to FIG. 1D. These and other variations and/or modifications to the polymer layer 129 are possible and are fully intended to be included within the scope of the present disclosure.

Figure 4:
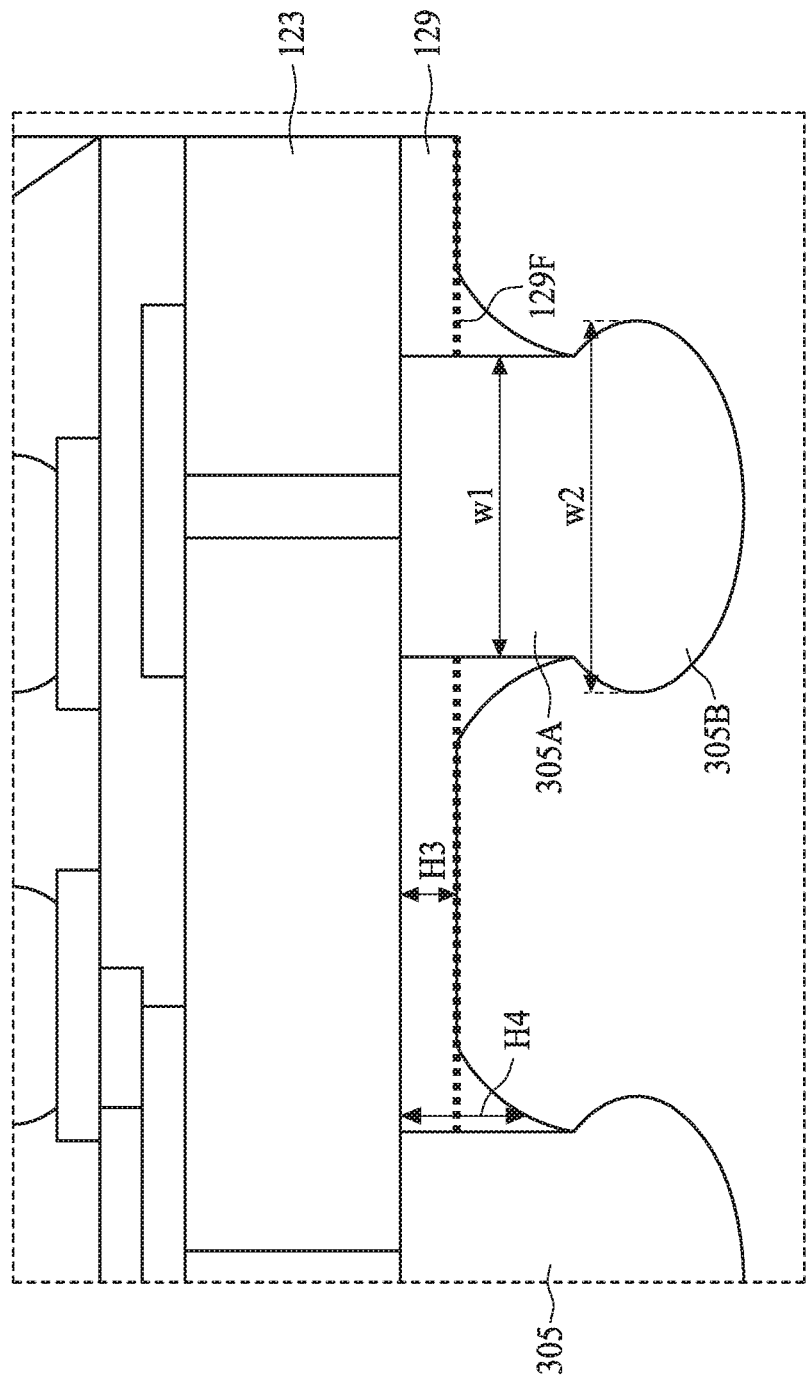
FIG. 4 illustrates a zoomed-in view of an area of FIG. 3C.

FIG. 4 illustrates a zoomed-in view of area 309 in FIG. 3C. As illustrated in FIG. 4, the first portions 305B of the external connectors 305 have a width W2, which is larger than a width W1 of the second portions 305A of the external connectors 305. In some embodiments, the width W2 is in a range between about 80 µm to about 120 µm, and the width W1 is in a range between about 40 µm to about 80 µm.

In the example of FIG. 4, due to the wetting of the polymer layer 129 on the external connector 305, a first portion of the polymer layer 129 contacting sidewalls of the external connector 305 has a height H4 (also referred to as a thickness H4 of the polymer layer 129), and a second portion of the polymer layer away from the external connectors 305 (e.g., midway between two adjacent external connectors 305) has a height H3 (also referred to as a thickness H3 of the polymer layer 129). The height H4 is larger than the height H3, and the lower surface of the polymer layer 129 distal the first substrate 123 may have a round profile proximate the external connectors 305, as illustrated in the example of FIG. 4. Values of the height H3 and the height H4 may depend on various design factors, e.g., size of the external connectors 305, the wettability of polymer layer 129, and the amount of warpage to compensate for using the polymer layer 129. For example, in an embodiment where the height (measured along the same direction as H3) of the external connectors 305 is about 70 µm, the height H3 is between about 2 µm to about 40 µm, and the height H4 is between about 10 µm to about 70 µm. Other dimensions for the height H3 and the height H4 are possible and are fully intended to be included within the scope of the present disclosure.

Although the height H4 is shown to be larger than the height H3 in the example of FIG. 4, depending on the material of the polymer layer 129 and the wettability of the polymer layer 129 on the external connectors 305, the height H4 may be the same as the height H3, and the polymer layer 129 may have a flat upper surface 129F (see dashed line) contacting the sidewalls of the external connectors 305, in some embodiments.

Figure 5A:
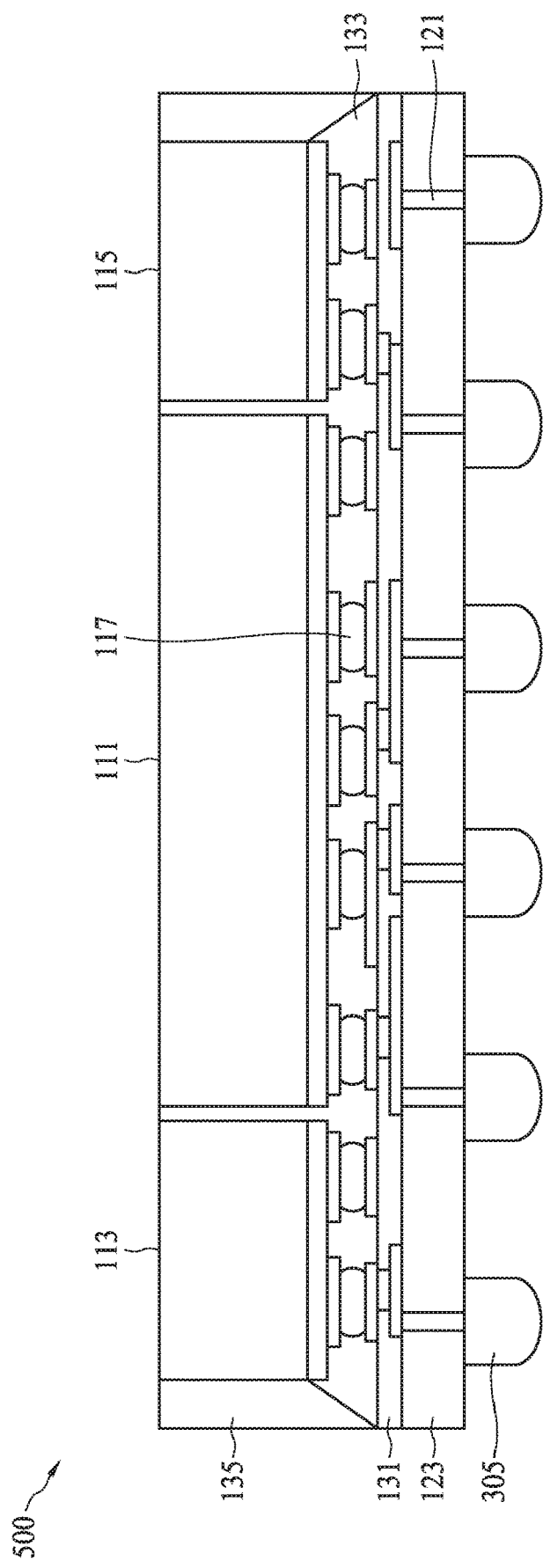
FIGS. 5A-5C illustrate cross-section views of a semiconductor device at various stages of fabrication, in an embodiment.
Figure 5B:
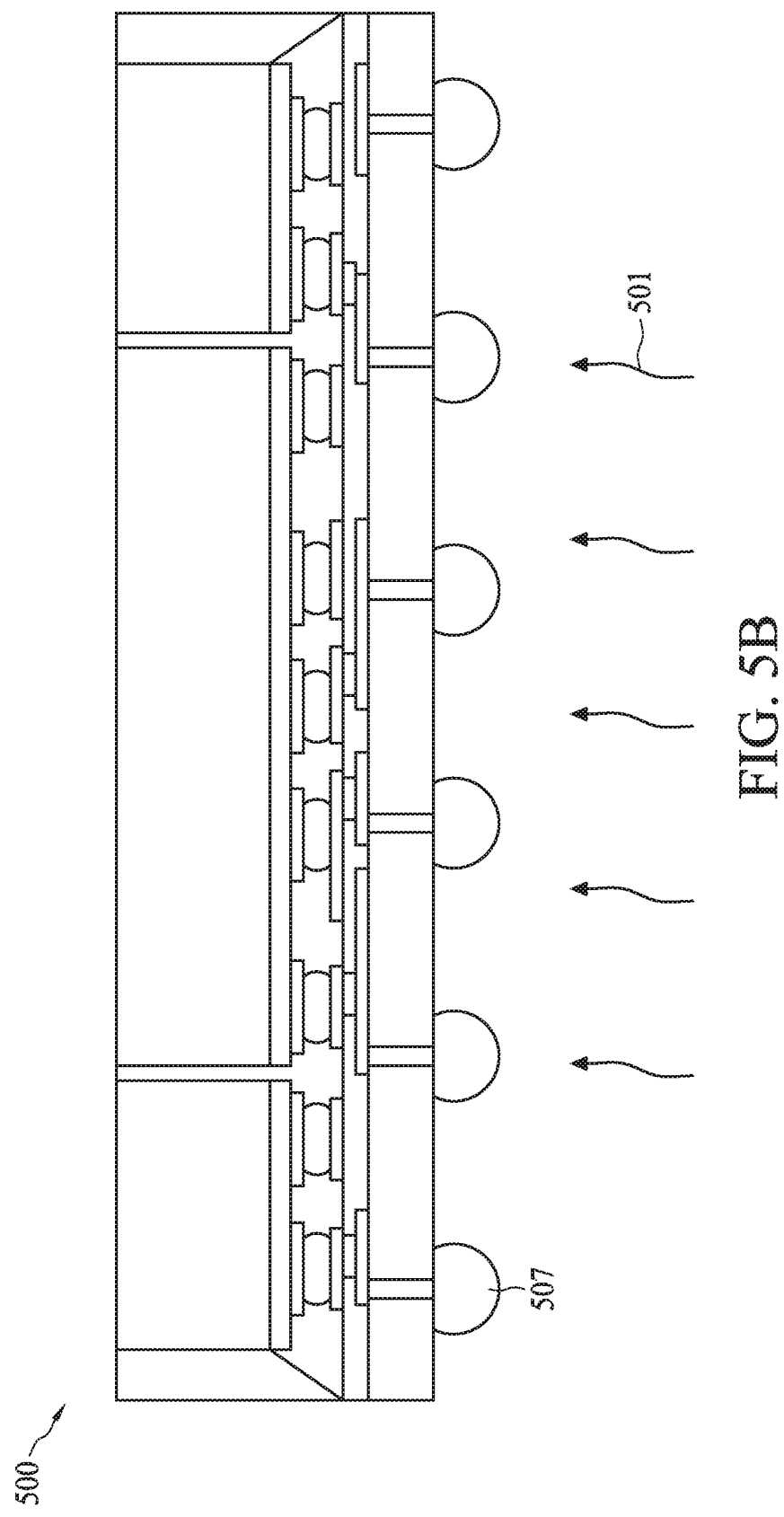
Figure 5C:
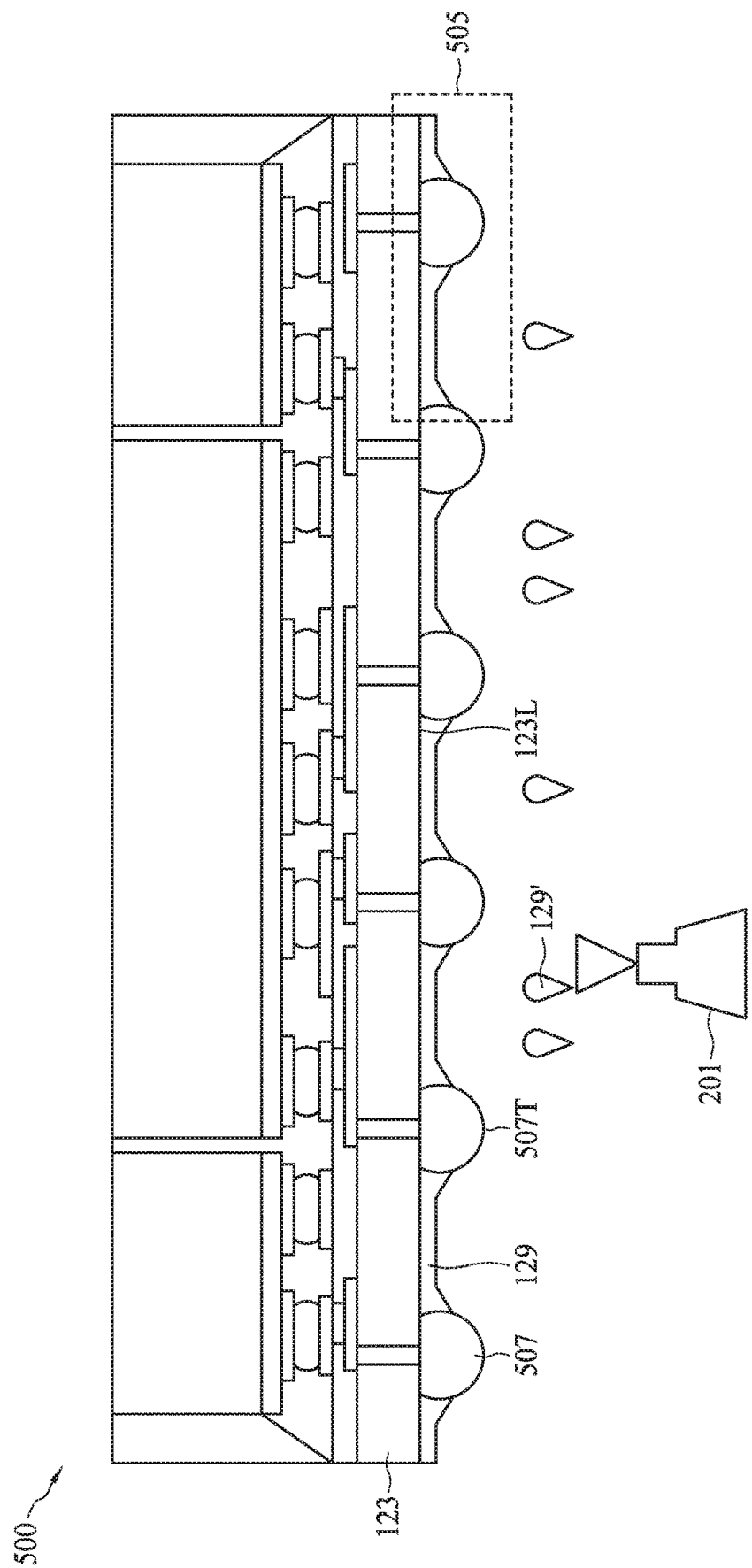

FIGS. 5A-5C illustrate cross-sectional views of a semiconductor device 500 at various stages of fabrication, in some embodiments. For simplicity, FIGS. 5A-5C only illustrate one semiconductor device, with the understanding that tens, hundreds, or even thousands of semiconductor devices 500 may be formed on an interposer and singulated subsequently to form a plurality of semiconductor devices 500. The same numerals in FIG. 5A-5C denote the same elements or structures as in FIG. 1B. Unless otherwise described, elements or structures with the same numerals are formed of the same material and using the same formation methods, hence details are not repeated.

In FIG. 5A, a semiconductor device 500 is formed. Semiconductor device 500 is similar to the semiconductor device 300 in FIG. 3A before the polymer material 129' is dispensed, details are not repeated here.

Next, in FIG. 5B, a reflow process 501 is performed. As a result of the reflow process 501, the external connectors 305, which are made of solder, melt and re-solidify after the reflow process is finished. Due to the surface tension of the melt solder, the profile of the external connectors 305 after the reflow process change to a round profile (e.g., a sphere or portions of a sphere). The external connectors 305 after the reflow process 501 are denoted hereinafter as external connectors 507.

Next, as illustrated in FIG. 5C, the polymer material 129' is selectively dispensed over the second side 123L of the first substrate 123 without covering top surfaces 507T of the external connectors 507, e.g., between adjacent external connectors 507 and/or next to external connectors 507 using dispensing tool 201. Deposited polymer material 129' forms the polymer layer 129.

Once the polymer layer 129 is formed, a curing process, such as UV curing or thermal curing, may be performed to cure the polymer layer 129. In some embodiments, the curing process is a thermal curing process performed at a temperature between about 130° C. to about 250° C., such as 180° C., and for a time interval between about 30 minutes to about 4 hours, such as 90 minutes. In other embodiments, an UV curing process is performed to cure the polymer layer 129. The UV curing process may be performed using UV light with a wavelength between about 350 nm to about 396 nm, and a time interval for the UV curing process may be between about 5 seconds to about 180 seconds. The above curing processes are merely examples, other curing process and methods are also possible and are fully intended to be included within the scope of the present disclosure.

FIG. 5C shows the polymer layer 129 being formed over the second side 123L of the first substrate 123 and covering the center region and edge regions of the semiconductor device 500. In other embodiments (not shown), the polymer layer 129 is formed in the edge regions of the semiconductor device 500, and the center region of the semiconductor device 500 is free of (e.g., not covered by) the polymer layer 129, similar to FIG. 1D. These and other variations and/or modifications to the polymer layer 129 are possible and are fully intended to be included within the scope of the present disclosure.

Figure 6:
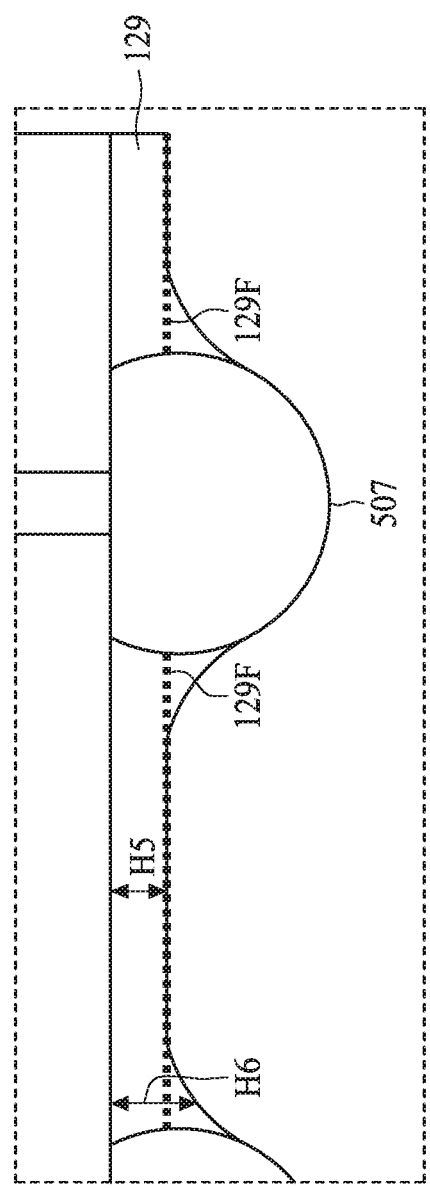
FIG. 6 illustrates a zoomed-in view of an area of FIG. 5C.

FIG. 6 shows a zoomed-in view of area 505 in FIG. 5C. As illustrated in FIG. 6, due to the wetting of the polymer layer 129 on the external connector 507, a first portion of the polymer layer 129 contacting sidewalls of the external connector 507 has a height H6, and a second portion of the polymer layer away from the external connectors 507 (e.g., midway between two adjacent external connectors 507) has a height H5. The height H6 is larger than the height H5, and the lower surface of the polymer layer 129 distal the first substrate 123 may have a round profile proximate the external connectors 507, as illustrated in the example of FIG. 6. Values of the height H5 and the height H6 may depend on various design factors, e.g., size of the external connectors 507, the wettability of the polymer layer 129, and the amount of warpage to compensate for using the polymer layer 129. For example, in an embodiment where the height (measured along the same direction as H5) of the external connectors 507 is about 70 µm, the height H5 is between about 2 µm to about 40 µm, and the height H6 is between about 10 µm to about 70 µm. Other dimensions for the height H5 and the height H6 are possible and are fully intended to be included within the scope of the present disclosure.

Although the height H6 is shown to be larger than the height H5 in the example of FIG. 6, depending on the material of the polymer layer 129 and the wettability of the polymer layer 129 on the external connectors 507, the height H6 may be the same as the height H5, and the polymer layer 129 may have a flat upper surface 129F (see dashed line) contacting the sidewalls of the external connectors 507, in some embodiments.

Figure 7:
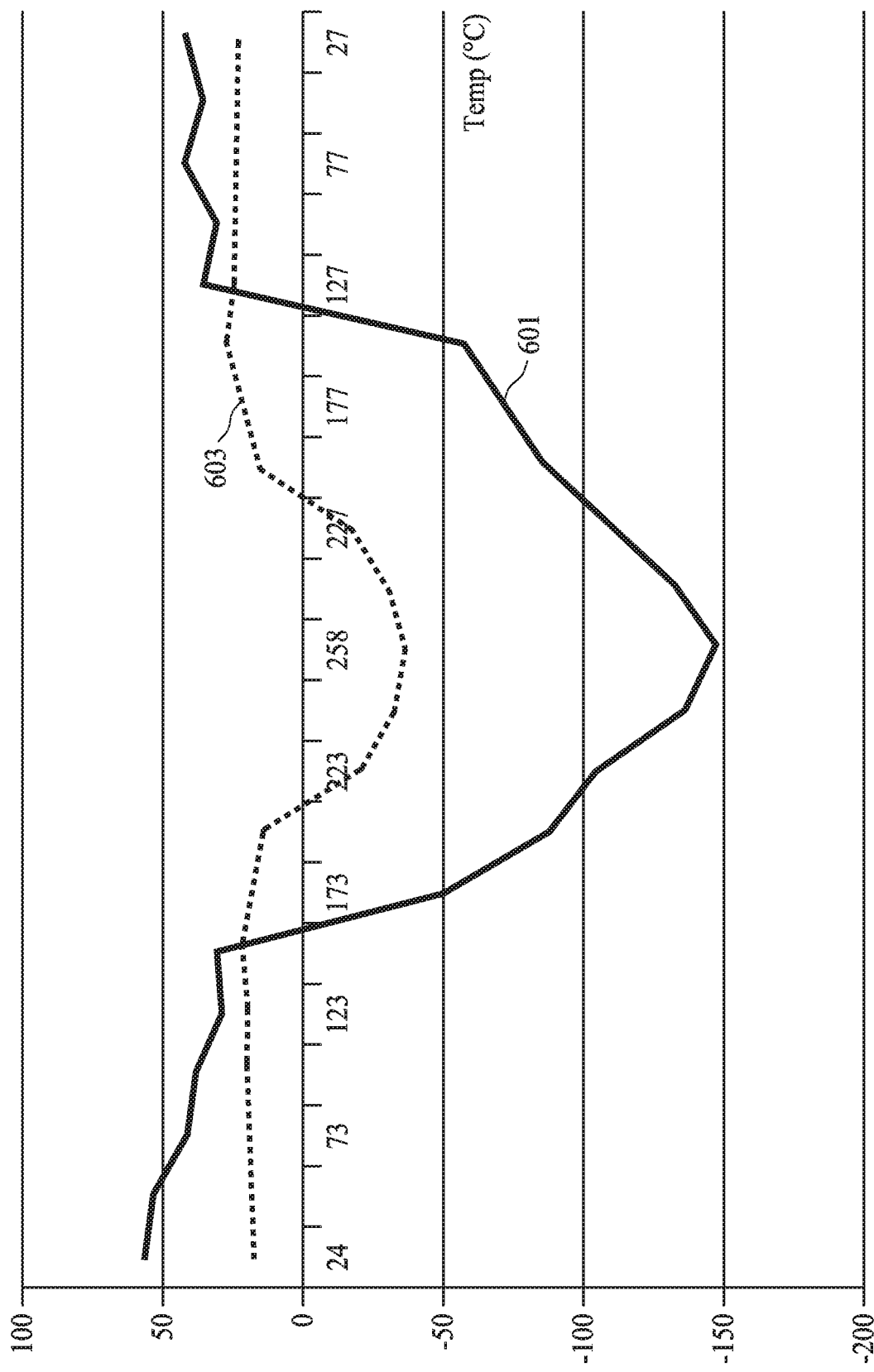
FIG. 7 illustrates the performance of an embodiment semiconductor device, in some embodiments.

FIG. 7 illustrates the performance comparison between a conventional semiconductor device without the polymer layer 129 and an embodiment device having the polymer layer 129. In particular, curve 601 corresponds to the conventional device, and curve 603 corresponds to the embodiment device (e.g., semiconductor device 100, 300, or 500) with the polymer layer 129. The x-axis represents the temperature (which rises from room temperature to 258° C., then decreases back to room temperature), and y-axis represent the amount of warpage in units of micrometer (μm). A positive warpage value indicates that the edge portions of the semiconductor device (e.g., portions of semiconductor device 100 in regions 103 of FIG. 1B) bend upwards relative to the center portion of the semiconductor device (e.g., the portion of semiconductor device 100 in region 101 of FIG. 1B). Conversely, a negative warpage value indicates that the edge portions of the semiconductor device bend downwards relative to the center portion of the semiconductor device. The warpage value may be determined by measuring the distance between top surfaces of the external connectors in the center region 101 and the edge regions 103. It is clear from FIG. 7 that the embodiment device has less warpage than the conventional device at both room temperature and high temperature (e.g., around 258° C.). In FIG. 7, the worst warpage (e.g., the maximum of the absolute value of the measured warpage) is about 60 μm. The reduced warpage of the embodiment device indicates less stress on the semiconductor device, lower device failure rate, and improved device performance. Cold solder joints and/or bridging of solder joints are reduced or prevented.

Figure 8:
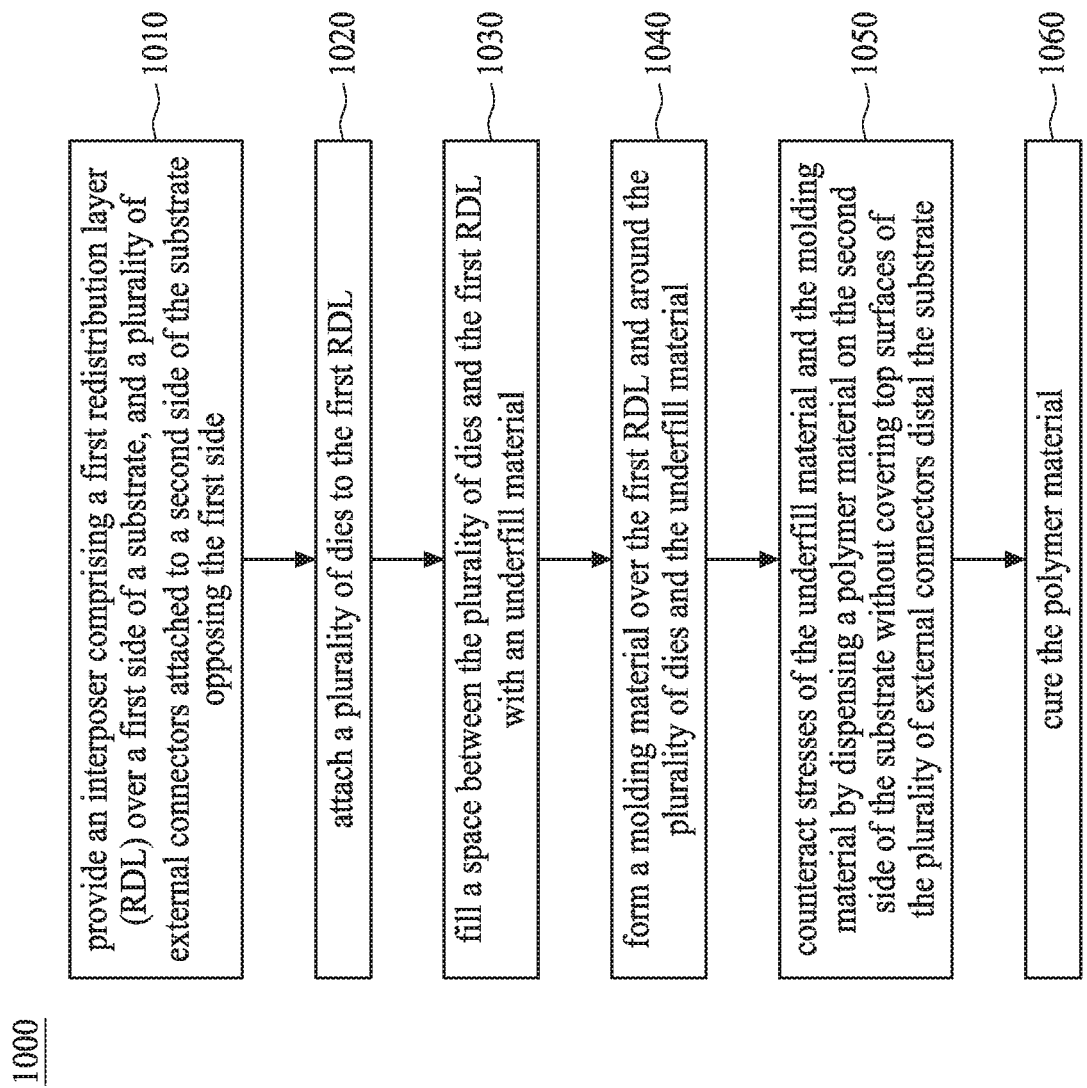
FIG. 8 illustrates a flowchart of a method of forming a semiconductor device, in some embodiments.

FIG. 8 illustrates a flow chart of a method 1000 of fabricating a semiconductor device, in accordance with some embodiments. It should be understood that the embodiment method shown in FIG. 8 is merely an example of many possible embodiment methods. One of ordinary skill in the art would recognize many variations, alternatives, and modifications. For example, various steps as illustrated in FIG. 8 may be added, removed, replaced, rearranged and repeated.

Referring to FIG. 8, at step 1010, an interposer is provided. The interposer includes a first redistribution layer (RDL) over a first side of a substrate, and a plurality of external connectors attached to a second side of the substrate opposing the first side. At step 1020, a plurality of dies are attached to the first RDL. At step 1030, a space between the plurality of dies and the first RDL is filled with an underfill material. At step 1040, a molding material is formed over the first RDL and around the plurality of dies and the underfill material. At step 1050, the stress of the underfill material and the molding material is counteracted by dispensing a polymer material on the second side of the substrate without covering top surfaces of the plurality of external connectors distal the substrate. At step 1060, the polymer material is cured.

Advantages of the present disclosure include reduce warpage in semiconductor devices. The reduced warpage prevents cold solder joints and/or bridging of solder joints. Device reliability is improved, and yield of semiconductor processing is improved.

In some embodiments, a semiconductor device includes a substrate, a first redistribution layer (RDL) over a first side of the substrate, one or more semiconductor dies over and electrically coupled to the first RDL, and an encapsulant over the first RDL and around the one or more semiconductor dies. The semiconductor device also includes connectors attached to a second side of the substrate opposing the first side, the connectors being electrically coupled to the first RDL. The semiconductor device further includes a polymer layer on the second side of the substrate, the connectors protruding from the polymer layer above a first surface of the polymer layer distal the substrate, where a first portion of the polymer layer contacting the connectors has a first thickness, and a second portion of the polymer layer between adjacent connectors has a second thickness smaller than the first thickness.

In other embodiments, a method includes receiving an interposer, where the interposer includes a first substrate, a first redistribution layer (RDL) over a first side of the first substrate, and a plurality of external connectors on a second side of the first substrate opposing the first side, the plurality of external connectors being electrically coupled to the first RDL. The method further includes attaching a plurality of dies to the first RDL of the interposer, filling a gap between the interposer and the plurality of dies with a first dielectric material, and dispensing a second dielectric material on the second side of the first substrate without covering top surfaces of the plurality of external connectors prior to attaching the interposer to a second substrate.

In yet another embodiment, a method includes receiving an interposer having a first redistribution layer (RDL) over a first side of a substrate, and a plurality of external connectors attached to a second side of the substrate opposing the first side. The method also includes attaching a plurality of dies to the first RDL, filling a space between the plurality of dies and the first RDL with an underfill material, and forming a molding material over the first RDL and around the plurality of dies and the underfill material. The method further includes dispensing a polymer material on the second side of the substrate without covering top surfaces of the plurality of external connectors distal the substrate, and curing the polymer material.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a redistribution layer (RDL);
   a semiconductor die over and electrically coupled to the RDL;
   a conductive connector below the RDL, wherein the conductive connector has a homogeneous composition; and
   a polymer layer below the RDL, wherein an uppermost surface of the polymer layer facing the semiconductor die is level with an uppermost surface of the conductive connector facing the semiconductor die, wherein a lowermost surface of the conductive connector distal from the semiconductor die extends further from the semiconductor die than a lowermost surface of the polymer layer distal from the semiconductor die, wherein the polymer layer has a first thickness at a first location contacting the conductive connector and has a second thickness at a second location away from the conductive connector, wherein the second thickness is smaller than the first thickness.

2. The semiconductor device of claim 1, wherein the polymer layer comprises polyimide (PI), polybenzoxazole (PBO), resin, epoxy, acrylic type polymer, an underfill material, a molding material, or combinations thereof.

3. The semiconductor device of claim 1, wherein the conductive connector is a solder connector.

4. The semiconductor device of claim 1, further comprising a substrate, wherein the RDL is on a first side of the substrate, and wherein the polymer layer and the conductive connector are on a second side of the substrate opposing the first side.

5. The semiconductor device of claim 4, wherein the conductive connector extends further from the substrate than the polymer layer, wherein a first portion of the conductive connector surrounded by the polymer layer has straight sidewalls, and a second portion of the conductive connector extending above the polymer layer has curved sidewalls.

6. The semiconductor device of claim 4, wherein the conductive connector extends further from the substrate than the polymer layer, wherein the conductive connector has curved sidewalls that extend from the second side of the substrate to the lowermost surface of the conductive connector.

7. The semiconductor device of claim 4, further comprising:
an underfill material between the substrate and the semiconductor die; and
a molding material on the first side of the substrate and around the semiconductor die and around the underfill material.

8. The semiconductor device of claim 4, wherein the uppermost surface of the conductive connector and the uppermost surface of the polymer layer contact and extend along the second side of the substrate.

9. The semiconductor device of claim 4, wherein the polymer layer covers a first region of the second side of the substrate and exposes a second region of the second side of the substrate.

10. The semiconductor device of claim 9, wherein the first region is a perimeter region of the second side of the substrate, and the second region is a center region of the second side of the substrate.

11. A semiconductor device comprising:
a redistribution layer (RDL);
one or more semiconductor dies over and electrically coupled to the RDL;
an encapsulant over the RDL and around the one or more semiconductor dies;
connectors electrically coupled to the RDL; and
a polymer layer at a same side of the RDL with the connectors, wherein first surfaces of the connectors facing the RDL are level with a first surface of the polymer layer facing the RDL, and second surfaces of the connectors facing away from the RDL are further from the RDL than a second surface of the polymer layer facing away from the RDL, wherein the connectors comprise a same material that extends continuously from the first surfaces of the connectors to the second surfaces of the connectors, wherein a first portion of the polymer layer contacting the connectors has a first thickness, and a second portion of the polymer layer between adjacent connectors has a second thickness smaller than the first thickness.

12. The semiconductor device of claim 11, wherein the one or more semiconductor dies are at a first side of the RDL, and wherein the connectors and the polymer layer are at a second side of the RDL opposing the first side.

13. The semiconductor device of claim 12, wherein first portions of the connectors embedded in the polymer layer have straight sidewalls, and second portions of the connectors outside the polymer layer have curved sidewalls.

14. The semiconductor device of claim 12, further comprising a substrate, wherein the RDL is on a first surface of the substrate, wherein the polymer layer and the connectors are on a second surface of the substrate opposite the first surface.

15. The semiconductor device of claim 14, wherein the connectors extend further from the substrate than the polymer layer, wherein the connectors have curved sidewalls that extends from the substrate to the second surfaces of the connectors distal from the substrate.

16. The semiconductor device of claim 14, wherein the polymer layer covers a first region on the second surface of the substrate and exposes a second region of the second surface of the substrate.

17. A semiconductor device comprising:
a substrate having an external connector bonded to a second side of the substrate, the external connector having a uniform composition and comprising a solder material, the external connector contacting the second side of the substrate;
a semiconductor die bonded to a first side of the substrate opposing the second side; and
a polymer layer extending along and contacting the second side of the substrate, wherein a first region of the second side of the substrate is covered by the polymer layer, and a second region of the second side of the substrate is exposed by the polymer layer, wherein the polymer layer contacts and extends along a lower sidewall of the external connector, wherein an upper sidewall of the external connector extends further from the substrate than the polymer layer.

18. The semiconductor device of claim 17, wherein the polymer layer has a first thickness at a first location contacting the external connector, and wherein the polymer layer has a second thickness at a second location away from the external connector, the second thickness being smaller than the first thickness.

19. The semiconductor device of claim 17, wherein the external connector has a first portion surrounded by the polymer layer, and has a second portion extending above an upper surface of the polymer layer distal from the substrate, wherein the first portion of the external connector has straight sidewalls, and the second portion of the external connector has curved sidewalls.

20. The semiconductor device of claim 17, wherein the external connector extends above an upper surface of the polymer layer distal from the substrate, wherein the external connector has curved sidewalls that extend from the substrate to an upper surface of the external connector distal from the substrate.

* * * * *